US012710487B2

(12) United States Patent
Isoda et al.

(10) Patent No.: US 12,710,487 B2
(45) Date of Patent: Aug. 18, 2026

(54) MAGNETIC SENSOR

(71) Applicant: TDK CORPORATION, Tokyo (JP)

(72) Inventors: Takehiro Isoda, Tokyo (JP); Norikazu Ota, Tokyo (JP)

(73) Assignee: TDK CORPORATION, Tokyo (JP)

( * ) Notice: Subject to any disclaimer, the term of this patent is extended or adjusted under 35 U.S.C. 154(b) by 199 days.

(21) Appl. No.: 18/642,084

(22) Filed: Apr. 22, 2024

(65) Prior Publication Data

US 2024/0361403 A1 Oct. 31, 2024

(30) Foreign Application Priority Data

Apr. 26, 2023 (JP) ................................ 2023-072210

(51) Int. Cl.
*G01R 33/09* (2006.01)

(52) U.S. Cl.
CPC .................................. *G01R 33/09* (2013.01)

(58) Field of Classification Search
CPC ................................................... G01R 33/09
See application file for complete search history.

(56) References Cited

U.S. PATENT DOCUMENTS

| | | | | |
|---|---|---|---|---|
| 2002/0024776 | A1* | 2/2002 | Sasaki | G11B 5/3967 |
| 2012/0217961 | A1 | 8/2012 | Ando et al. | |
| 2014/0375311 | A1 | 12/2014 | Ishii et al. | |
| 2017/0211935 | A1 | 7/2017 | Deak et al. | |
| 2018/0113176 | A1* | 4/2018 | Nagata | G01R 33/0005 |
| 2018/0164386 | A1 | 6/2018 | Deak et al. | |
| 2019/0293734 | A1 | 9/2019 | Watanabe et al. | |
| 2020/0064414 | A1* | 2/2020 | Uchida | G01R 33/091 |
| 2021/0096194 | A1* | 4/2021 | Cai | G01R 33/091 |
| 2021/0096196 | A1* | 4/2021 | Cai | G01R 33/0076 |
| 2022/0260654 | A1* | 8/2022 | Kobayashi | G01R 33/4215 |

FOREIGN PATENT DOCUMENTS

JP 2016-186457 A 10/2016

* cited by examiner

*Primary Examiner* — Paresh Patel
(74) *Attorney, Agent, or Firm* — Oliff PLC

(57) ABSTRACT

A magnetic sensor includes a plurality of MR elements, a plurality of yokes each including a portion long in a first direction, and a plurality of shields each including a portion long in a second direction. The plurality of MR elements include a plurality of first specific elements. The plurality of yokes include a plurality of yoke pairs each including one of the plurality of first specific elements. The plurality of shields include a plurality of shield pairs each with one of the plurality of first specific elements therebetween. The plurality of first specific elements are arranged in a direction intersecting both the first direction and the second direction.

15 Claims, 10 Drawing Sheets

MAGNETIC SENSOR

CROSS REFERENCE TO RELATED APPLICATIONS

This application claims the benefit of Japanese Priority Patent Application No. 2023-072210 filed on Apr. 26, 2023, the entire contents of which are incorporated herein by reference.

BACKGROUND

The technology relates to a magnetic sensor that includes a plurality of magnetic detection elements and a plurality of yokes and is configured to detect a magnetic field in a predetermined direction.

Magnetic sensors have been used for a variety of applications in recent years. Examples of known magnetic sensors include one that uses a plurality of magnetic detection elements provided on a substrate. As the magnetic detection elements, magnetoresistive elements are used, for example. To detect a magnetic field in a predetermined direction, a magnetic sensor including a soft magnetic body that receives a magnetic field to be detected and outputs a magnetic field component in a desired direction has been known.

US 2019/0293734 A1 discloses a magnetic sensor device including a first magnetic sensor that detects a component of an external magnetic field in a direction parallel to an X direction, a second magnetic sensor that detects a component of the external magnetic field in a direction parallel to a Y direction, a third magnetic sensor that detects a component of the external magnetic field in a direction parallel to a Z direction, a magnetic field conversion section that includes a plurality of yokes, and a soft magnetic layer. The magnetic field conversion section receives a magnetic field component in the direction parallel to the Z direction and outputs a magnetic field component to be applied to the third magnetic sensor. The third magnetic sensor is configured to detect the magnetic field component output from the magnetic field conversion section. The soft magnetic layer covers the entire third magnetic sensor.

US 2017/0211935 A1 discloses a Y-axis magnetic sensor including magnetoresistive sensing units respectively located near four corners of a soft magnetic flux concentrator. In this Y-axis magnetic sensor, the magnetoresistive sensing units near two of the four corners are push-arm magnetoresistive sensing units. The magnetoresistive sensing units near the other two of the four corners are pull-arm magnetoresistive sensing units. The pinning layers of the push-arm magnetoresistive sensing units and those of the pull-arm magnetoresistive sensing units are magnetized in the same direction. Under the action of an external magnetic field in a direction parallel to a Y-axis, the magnetic field directions of the free layers of the push- and pull-arms are opposite.

In general, a magnetic sensor includes a bridge circuit constituted by a plurality of magnetic detection elements. The bridge circuit includes two or four arms. In each of the two or four arms, a plurality of magnetic detection elements are connected in series.

Like the Y-axis magnetic field sensor described in US 2017/0211935 A1, a magnetic sensor including a soft magnetic body that receives a magnetic field to be detected and outputs a magnetic field component in a desired direction varies in the direction of the magnetic field component applied to the magnetic detection elements depending on the positional relationship between the soft magnetic body and the magnetic detection elements. In such a magnetic sensor, the plurality of magnetic detection elements therefore need to be laid out so that the magnetic field component of the same direction is applied to the plurality of magnetic detection elements in each arm. However, to constitute a bridge circuit with the plurality of magnetic detection elements laid out in this way complicates the structure of wiring for electrically connecting the plurality of magnetic detection elements. This problem is particularly pronounced if the number of magnetic detection elements per unit area is increased to improve the sensitivity of the magnetic sensor.

SUMMARY

A magnetic sensor according to one embodiment of the technology includes a plurality of magnetic detection elements, a plurality of yokes each including a portion long in a first direction, and a plurality of shields each including a portion long in a second direction intersecting the first direction. The plurality of magnetic detection elements include a plurality of first specific elements electrically connected to each other. The plurality of yokes include a plurality of yoke pairs each including a first specific yoke and a second specific yoke arranged with one of the plurality of first specific elements therebetween. In each of the plurality of yoke pairs, the first specific yoke and the second specific yoke are located at respective different positions in a direction parallel to the first direction, with the one first specific element between the first specific yoke and the second specific yoke at the center. The plurality of shields include a plurality of shield pairs each including a first specific shield and a second specific shield arranged with one of the plurality of first specific elements therebetween. The plurality of first specific elements are arranged in a direction intersecting both the first direction and the second direction.

In the magnetic sensor according to one embodiment of the technology, the plurality of first specific elements are arranged in the direction intersecting both the first direction and the second direction. According to one embodiment of the technology, a magnetic sensor capable of simplifying the structure of wiring for electrically connecting the plurality of magnetic detection elements can thereby be implemented.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
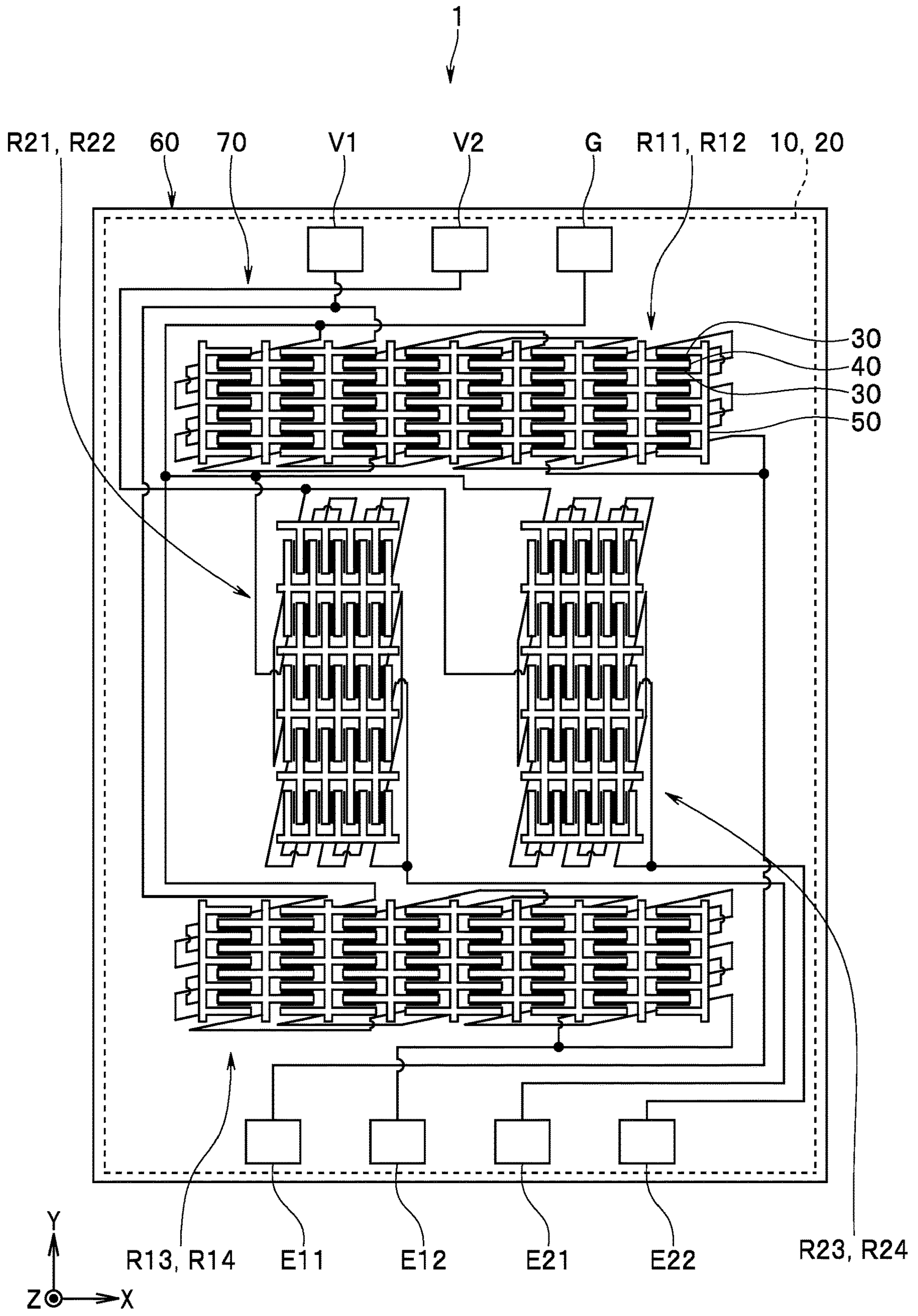
FIG. 1 is a plan view showing a magnetic sensor according to a first example embodiment of the technology.

An object of the technology is to provide a magnetic sensor that includes a plurality of magnetic detection elements and a plurality of yokes, is configured to detect a magnetic field in a predetermined direction, and is capable of simplifying the structure of wiring for electrically connecting the plurality of magnetic detection elements while increasing the number of magnetic detection elements per unit area.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Initially, a schematic configuration of a magnetic sensor according to a first example embodiment of the technology will be described with reference to FIG. 1. FIG. 1 is a plan view showing a magnetic sensor 1 according to the example embodiment. The magnetic sensor 1 according to the example embodiment includes a plurality of magnetic detection elements, a plurality of yokes 40, a plurality of shields 50, and a support member 60 supporting the plurality of magnetic detection elements, the plurality of yokes 40, and the plurality of shields 50.

The support member 60 may have a rectangular solid shape. The support member 60 has a first surface, a second surface located opposite to the first surface, and four side surfaces connecting the first surface and the second surface. FIG. 1 shows the magnetic sensor 1 as seen from the first surface side of the support member 60.

Now, we define X, Y, and Z directions as shown in FIG. 1. The X, Y, and Z directions are orthogonal to one another. In particular, in the example embodiment, a direction perpendicular to the first surface of the support member 60 and from the second surface to the first surface of the support member 60 will be referred to as the Z direction. The opposite directions to the X, Y, and Z directions will be referred to as −X, −Y, and −Z directions, respectively.

Hereinafter, the term "above" refers to positions located forward of a reference position in the Z direction, and "below" refers to positions opposite from the "above" positions with respect to the reference position. For each component of the magnetic sensor 1, the term "top surface" refers to a surface of the component located at the end thereof in the Z direction, and "bottom surface" refers to a surface of the component located at the end thereof in the −Z direction. The first surface of the support member 60 is also the top surface of the support member 60. The second surface of the support member 60 is also the bottom surface of the support member 60. The phrase "when seen in the Z direction" means that an object is seen from a position at a distance in the Z direction.

The magnetic sensor 1 further includes a first detection circuit 10 and a second detection circuit 20. The first and second detection circuits 10 and 20 are each constituted by a plurality of magnetic detection elements. In particular, in the example embodiment, the plurality of magnetic detection elements are a plurality of magnetoresistive elements 30. Magnetoresistive elements will hereinafter be referred to as MR elements.

The first detection circuit 10 is configured to detect a component of a target magnetic field in one direction and generate at least one first detection signal having a correspondence with the component. The second detection circuit 20 is configured to detect a component of the target magnetic field in another direction and generate at least one second detection signal having a correspondence with the component. In particular, in the example embodiment, the first detection circuit 10 is configured to detect a component of the target magnetic field in a direction parallel to the X direction. The second detection circuit 20 is configured to detect a component of the target magnetic field in a direction parallel to the Y direction.

Each of the first and second detection circuits 10 and 20 includes a plurality of resistor sections constituted by the plurality of MR elements 30. The plurality of MR elements 30 are disposed such that several MR elements are provided in each resistor section, and electrically connected to each other.

The plurality of yokes 40 are disposed such that several yokes are provided in each resistor section. Similarly, the plurality of shields 50 are disposed such that several shields are provided in each resistor section. Each of the plurality of yokes 40 and the plurality of shields 50 is made of a soft magnetic body.

Figure 2:
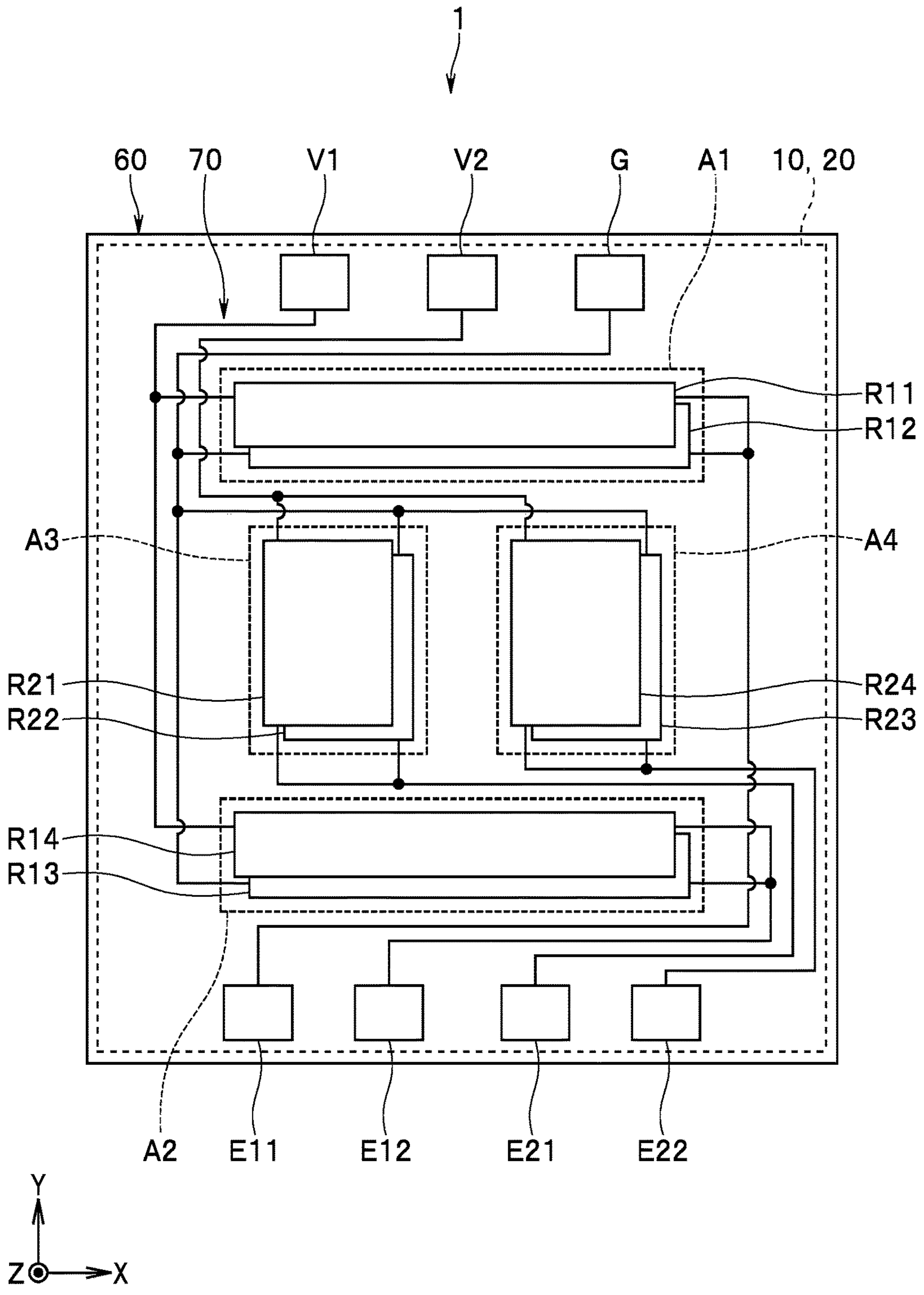
FIG. 2 is a plan view showing an element layout area of the magnetic sensor according to the first example embodiment of the technology.
Figure 3:
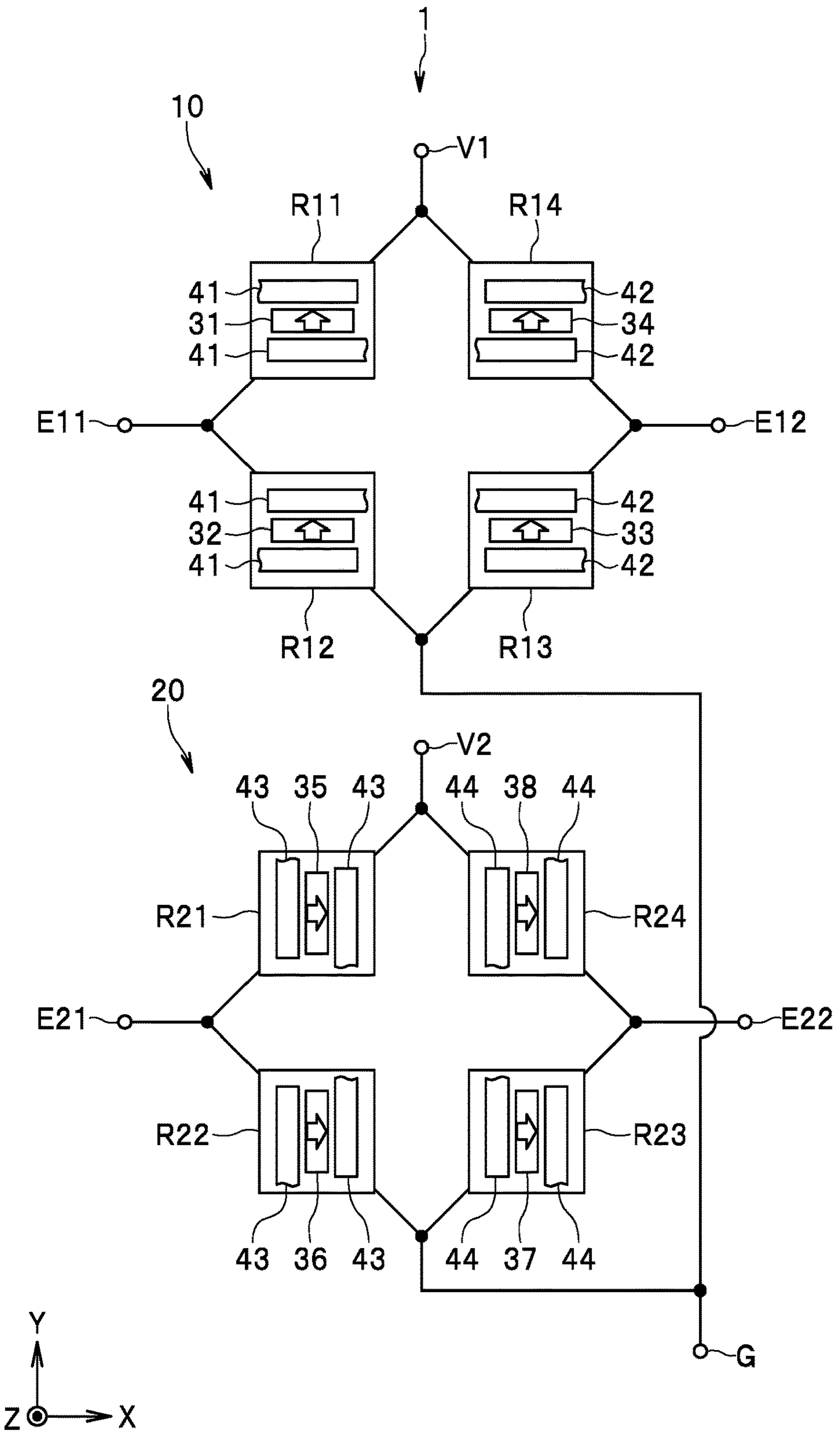
FIG. 3 is a circuit diagram showing a circuit configuration of the magnetic sensor according to the first example embodiment of the technology.

Next, a configuration of the magnetic sensor 1 will be described in detail with reference to FIGS. 1 to 3. FIG. 2 is a plan view showing an element layout area of the magnetic sensor 1. FIG. 3 is a circuit diagram showing a circuit configuration of the magnetic sensor 1.

As shown in FIG. 3, the first detection circuit 10 includes a power supply terminal V1, a ground terminal G, a first output terminal E11, a second output terminal E12, a first resistor section R11, a second resistor section R12, a third resistor section R13, and a fourth resistor section R14.

The first resistor section R11 is provided between the power supply terminal V1 and the first output terminal E11 in a circuit configuration. The second resistor section R12 is provided between the ground terminal G and the first output terminal E11 in the circuit configuration. The third resistor section R13 is provided between the ground terminal G and the second output terminal E12 in the circuit configuration. The fourth resistor section R14 is provided between the power supply terminal V1 and the second output terminal E12 in the circuit configuration. As employed in this application, the expression "in a circuit configuration" is used to indicate a layout in a circuit diagram and not a layout in a physical configuration.

The plurality of MR elements 30 include a plurality of first MR elements 31, a plurality of second MR elements 32, a plurality of third MR elements 33, and a plurality of fourth MR elements 34. The plurality of first MR elements 31 are electrically connected to each other and constitute the first resistor section R11. The plurality of second MR elements 32 are electrically connected to each other and constitute the second resistor section R12. The plurality of third MR elements 33 are electrically connected to each other and constitute the third resistor section R13. The plurality of fourth MR elements 34 are electrically connected to each other and constitute the fourth resistor section R14. The plurality of first MR elements 31, the plurality of second MR elements 32, the plurality of third MR elements 33, and the plurality of fourth MR elements 34 each may be connected in series.

As shown in FIG. 3, the second detection circuit 20 includes a power supply terminal V2, the ground terminal G, a third output terminal E21, a fourth output terminal E22, a fifth resistor section R21, a sixth resistor section R22, a seventh resistor section R23, and an eighth resistor section R24. The ground terminal G is a component of the first detection circuit 10 and a component of the second detection circuit 20 as well.

The fifth resistor section R21 is provided between the power supply terminal V2 and the third output terminal E21 in the circuit configuration. The sixth resistor section R22 is provided between the ground terminal G and the third output terminal E21 in the circuit configuration. The seventh resistor section R23 is provided between the ground terminal G and the fourth output terminal E22 in the circuit configuration. The eighth resistor section R24 is provided between the power supply terminal V2 and the fourth output terminal E22 in the circuit configuration.

The plurality of MR elements 30 further include a plurality of fifth MR elements 35, a plurality of sixth MR elements 36, a plurality of seventh MR elements 37, and a plurality of eighth MR elements 38. The plurality of fifth MR elements 35 are electrically connected to each other and constitute the fifth resistor section R21. The plurality of sixth MR elements 36 are electrically connected to each other and constitute the sixth resistor section R22. The plurality of seventh MR elements 37 are electrically connected to each other and constitute the seventh resistor section R23. The plurality of eighth MR elements 38 are electrically connected to each other and constitute the eighth resistor section R24. The plurality of fifth MR elements 35, the plurality of sixth MR elements 36, the plurality of seventh MR elements 37, and the plurality of eighth MR elements 38 each may be connected in series.

As employed herein, an area for laying out the plurality of MR elements is referred to as an element layout area. The element layout area overlaps the support member 60 when the top surface of the support member 60 is seen in the Z direction. In particular, in the example embodiment, the element layout area includes a plurality of areas. The plurality of MR elements 30 are divided and disposed in the plurality of areas.

As shown in FIG. 2, in the example embodiment, the element layout area includes a first area A1, a second area A2, a third area A3, and a fourth A4 as the plurality of areas. The first area A1 and the second area A2 are located at a predetermined distance from each other. The third area A3 and the fourth area A4 are located between the first area A1 and the second area A2 and arranged in a direction orthogonal to the direction in which the first and second areas A1 and A2 are arranged. In particular, in the example embodiment, the first area A1 and the second area A2 are arranged in the direction parallel to the Y direction. The first area A1 is located in front of the second area A2 in the Y direction. The third area A3 and the fourth area A4 are arranged in the direction parallel to the X direction. The third area A3 is located in front of the fourth area A4 in the −X direction.

The first to fourth areas A1 to A4 may each have a shape long in one direction. In the example shown in FIG. 2, the first and second areas A1 and A2 each have a shape long in the direction parallel to the X direction. The third and fourth areas A3 and A4 each have a shape long in the direction parallel to the Y direction.

The plurality of first MR elements 31 and the plurality of second MR elements 32 are disposed in the first area A1. In other words, as shown in FIG. 2, the first resistor section R11 and the second resistor section R12 are disposed in the first area A1.

The plurality of third MR elements 33 and the plurality of fourth MR elements 34 are disposed in the second area A2. In other words, as shown in FIG. 2, the third resistor section R13 and the fourth resistor section R14 are disposed in the second area A2.

The plurality of fifth MR elements 35 and the plurality of sixth MR elements 36 are disposed in the third area A3. In other words, as shown in FIG. 2, the fifth resistor section R21 and the sixth resistor section R22 are disposed in the third area A3.

The plurality of seventh MR elements 37 and the plurality of eighth MR elements 38 are disposed in the fourth area A4. In other words, as shown in FIG. 2, the seventh resistor section R23 and the eighth resistor section R24 are disposed in the fourth area A4.

The magnetic sensor 1 further includes a wiring section 70. The wiring section 70 electrically connects the plurality of MR elements 30 with the power supply terminals V1 and V2, the ground terminal G, and the first to fourth output terminals E11, E12, E21, and E22. The wiring section 70 also electrically connects the plurality of MR elements 30 in each of the first to eighth resistor sections R11 to R14 and R21 to R24.

The power supply terminals V1 and V2 and the ground terminal G may be located in front of the first area A1 in the Y direction, for example. The first to fourth output terminals E11, E12, E21, and E22 may be located in front of the second area A2 in the −Y direction, for example.

The plurality of yokes 40 include a plurality of first yokes 41 disposed in the first area A1, a plurality of second yokes 42 disposed in the second area A2, a plurality of third yokes 43 disposed in the third area A3, and a plurality of fourth yokes 44 disposed in the fourth area A4. Each of the plurality of first yokes 41, the plurality of second yokes 42, the plurality of third yokes 43, and the plurality of fourth yokes

44 includes a portion long in a first direction. In particular, in the example embodiment, the first direction of the plurality of first yokes 41 and the plurality of second yokes 42 is the X direction. The first direction of the plurality of third yokes 43 and the plurality of fourth yokes 44 is the Y direction.

The plurality of first yokes 41 include a plurality of yoke pairs each including two first yokes 41 adjoining in the direction parallel to the Y direction. In each of the plurality of yoke pairs, the two first yokes 41 are arranged with one of the plurality of first MR elements 31 or one of the plurality of second MR elements 32 therebetween.

The plurality of second yokes 42 include a plurality of yoke pairs each including two second yokes 42 adjoining in the direction parallel to the Y direction. In each of the plurality of yoke pairs, the two second yokes 42 are arranged with one of the plurality of third MR elements 33 or one of the plurality of fourth MR elements 34 therebetween.

The plurality of third yokes 43 include a plurality of yoke pairs each including two third yokes 43 adjoining in the direction parallel to the X direction. In each of the plurality of yoke pairs, the two third yokes 43 are arranged with one of the plurality of fifth MR elements 35 or one of the plurality of sixth MR elements 36 therebetween.

The plurality of fourth yokes 44 include a plurality of yoke pairs each including two fourth yokes 44 adjoining in the direction parallel to the X direction. In each of the plurality of yoke pairs, the two fourth yokes 44 are arranged with one of the plurality of seventh MR elements 37 or one of the plurality of eighth MR elements 38 therebetween.

The plurality of shields 50 include a plurality of first shields disposed in the first area A1, a plurality of second shields disposed in the second area A2, a plurality of third shields disposed in the third area A3, and a plurality of fourth shields disposed in the fourth area A4. Each of the plurality of first shields, the plurality of second shields, the plurality of third shields, and the plurality of fourth shields includes a portion long in a second direction. In particular, in the example embodiment, the second direction of the plurality of first shields and the plurality of second shields is the Y direction. The second direction of the plurality of third shields and the plurality of fourth shields is the X direction.

The plurality of first shields include a plurality of shield pairs each including two first shields adjoining in the direction parallel to the X direction. In each of the plurality of shield pairs, the two first shields are arranged with at least one of the plurality of first MR elements 31 and at least one of the plurality of second MR elements 32 therebetween.

The plurality of second shields include a plurality of shield pairs each including two second shields adjoining in the direction parallel to the X direction. In each of the plurality of shield pairs, the two second shields are arranged with at least one of the plurality of third MR elements 33 and at least one of the plurality of fourth MR elements 34 therebetween.

The plurality of third shields include a plurality of shield pairs each including two third shields adjoining in the direction parallel to the Y direction. In each of the plurality of shield pairs, the two third shields are arranged with at least one of the plurality of fifth MR elements 35 and at least one of the plurality of sixth MR elements 36 therebetween.

The plurality of fourth shields include a plurality of shield pairs each including two fourth shields adjoining in the direction parallel to the Y direction. In each of the plurality of shield pairs, the two fourth shields are arranged with at least one of the plurality of seventh MR elements 37 and at least one of the plurality of eighth MR elements 38 therebetween.

Figure 4:
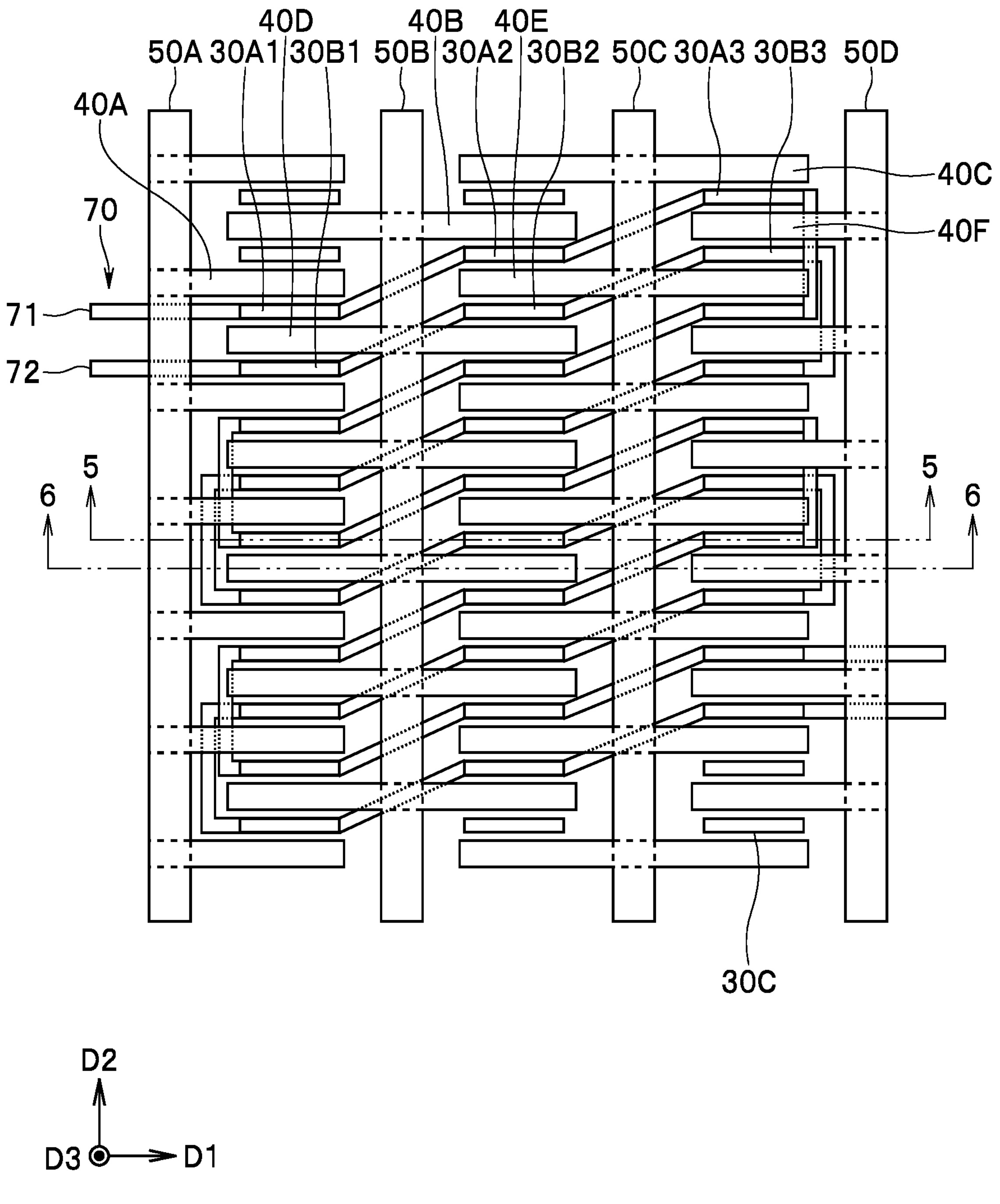
FIG. 4 is a plan view showing a plurality of magnetic detection elements, a plurality of yokes, and a plurality of shields of the first example embodiment of the technology.
Figure 5:
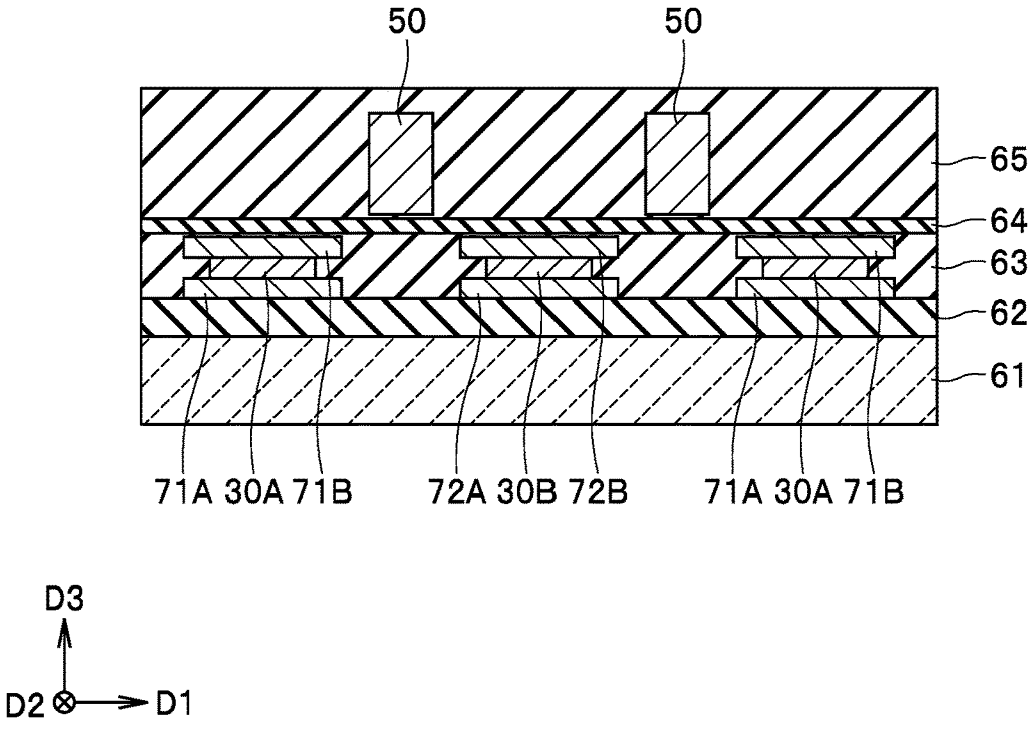
FIG. 5 is a sectional view showing a part of a section at the position indicated by line 5-5 in FIG. 4.
Figure 6:
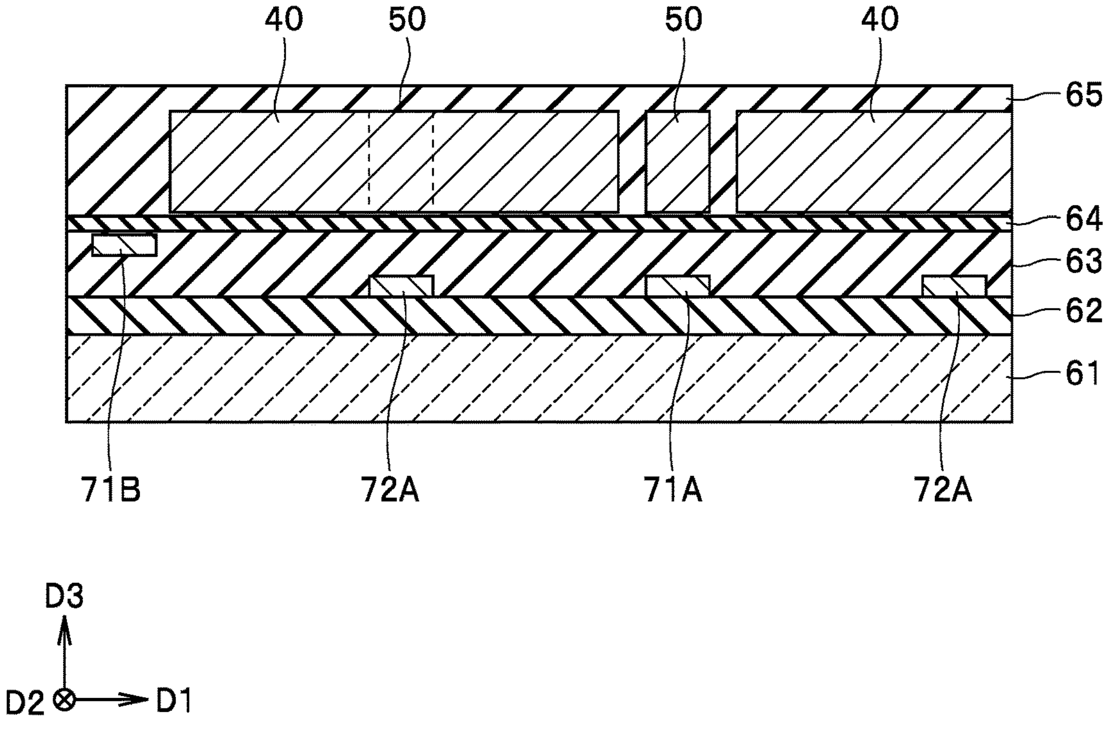
FIG. 6 is a sectional view showing a part of a section at the position indicated by line 6-6 in FIG. 4.

Next, the layout of the plurality of MR elements 30, the plurality of yokes 40, and the plurality of shields 50 will be described in detail with reference to FIGS. 4 to 6. FIG. 4 is a plan view showing the plurality of MR elements 30, the plurality of yokes 40, and the plurality of shields 50. FIG. 5 is a sectional view showing a part of a section at the position indicated by line 5-5 in FIG. 4. FIG. 6 is a sectional view showing a part of a section at the position indicated by line 6-6 in FIG. 4.

Initially, the layout of the plurality of MR elements 30 will be described in detail. FIG. 4 schematically shows the layout of the plurality of MR elements 30, the plurality of yokes 40, and the plurality of shields 50 disposed in one of the first to fourth areas A1 to A4 shown in FIG. 2. The plurality of MR elements 30 shown in FIG. 4 constitute two resistor sections disposed in the one of the first to fourth areas A1 to A4. To facilitate understanding, FIG. 4 shows the MR elements 30, yokes 40, and shields 50 in different numbers from those in FIG. 1. The numbers of MR elements 30, yokes 40, and shields 50 are not limited to the example shown in FIG. 1 or 4.

A first direction D1, a second direction D2, and a third direction D3 will be defined as shown in FIGS. 4 to 6. The first direction D1, the second direction D2, and the third direction D3 are orthogonal to each other. Each of the plurality of yokes 40 shown in FIG. 4 includes a portion long in the first direction D1. Each of the plurality of shields 50 shown in FIG. 4 includes a portion long in the second direction D2.

If FIG. 4 shows the plurality of MR elements 30, the plurality of yokes 40, and the plurality of shields 50 disposed in the first area A1 or the second area A2, the first direction D1 may be the same as the X direction, the second direction D2 the Y direction, and the third direction D3 the Z direction. If FIG. 4 shows the plurality of MR elements 30, the plurality of yokes 40, and the plurality of shields 50 disposed in the third area A3 or the fourth area A4, the first direction D1 may be the same as the Y direction, the second direction D2 the −X direction, and the third direction D3 the Z direction.

The plurality of MR elements 30 shown in FIG. 4 include a plurality of MR elements 30A constituting one of the two resistor sections, and a plurality of MR elements 30B constituting the other of the two resistor sections. For example, if FIG. 4 shows the plurality of MR elements 30 disposed in the first area A1, either the plurality of MR elements 30A or the plurality of MR elements 30B correspond to the plurality of first MR elements 31 constituting the first resistor section R11. The other of the plurality of MR elements 30A and the plurality of MR elements 30B correspond to the plurality of second MR elements 32 constituting the second resistor section R12.

The wiring section 70 includes first wiring 71 for electrically connecting the plurality of MR elements 30A and second wiring 72 for electrically connecting the plurality of MR elements 30B. In particular, in the example embodiment, the plurality of MR elements 30A are connected in series by the first wiring 71. The plurality of MR elements 30B are connected in series by the second wiring 72. In the example shown in FIG. 4, the plurality of MR elements 30 further include a plurality of MR elements 30C not connected to the first wiring 71 and the second wiring 72.

As shown in FIGS. 5 and 6, the first wiring 71 includes a plurality of lower electrodes 71A and a plurality of upper electrodes 71B. The plurality of MR elements 30A are connected in series by the plurality of lower electrodes 71A and the plurality of upper electrodes 71B. The second wiring 72 includes a plurality of lower electrodes 72A and a plurality of upper electrodes 72B. The plurality of MR elements 30B are connected in series by the plurality of lower electrodes 72A and the plurality of upper electrodes 72B.

The plurality of MR elements 30A include a plurality of electrically connected first specific elements 30A1, 30A2, and 30A3. In particular, in the example embodiment, the plurality of first specific elements 30A1, 30A2, and 30A3 are connected in series. The plurality of first specific elements 30A1, 30A2, and 30A3 are arranged in a direction intersecting both the first direction D1 and the second direction D2.

A group including the plurality of first specific elements 30A1, 30A2, and 30A3 arranged in a row in the direction intersecting both the first direction D1 and the second direction D2 will be referred to as a first element group. The plurality of MR elements 30A include a plurality of first element groups arranged in a direction parallel to the second direction D2. The plurality of MR elements 30A thus include a plurality of first specific elements 30A1, a plurality of first specific elements 30A2, and a plurality of first specific elements 30A3. The plurality of first element groups are connected in series by the first wiring 71.

The plurality of first specific elements 30A1 are arranged in the direction parallel to the second direction D2. In FIG. 4, one first specific element 30A1 is denoted by the reference numeral as a representative of the plurality of first specific elements 30A1. Similarly, the plurality of first specific elements 30A2 are arranged in the direction parallel to the second direction D2. In FIG. 4, one first specific element 30A2 directly electrically connected to the first specific element 30A1 denoted by the reference numeral is denoted by the reference numeral as a representative of the plurality of first specific elements 30A2. Similarly, the plurality of first specific elements 30A3 are arranged in the direction parallel to the second direction D2. In FIG. 4, one first specific element 30A3 directly electrically connected to the first specific element 30A2 denoted by the reference numeral is denoted by the reference numeral as a representative of the plurality of first specific elements 30A3.

The plurality of MR elements 30B include a plurality of electrically connected second specific elements 30B1, 30B2, and 30B3. In particular, in the example embodiment, the plurality of second specific elements 30B1, 30B2, and 30B3 are connected in series. The plurality of second specific elements 30B1, 30B2, and 30B3 are arranged in a direction intersecting both the first direction D1 and the second direction D2. In particular, in the example embodiment, the plurality of second specific elements 30B1, 30B2, and 30B3 are arranged in the same direction or almost the same direction as that in which the plurality of first specific elements 30A1, 30A2, and 30A3 are arranged.

A group including the plurality of second specific elements 30B1, 30B2, and 30B3 arranged in a row in the direction intersecting both the first direction D1 and the second direction D2 will be referred to as a second element group. The plurality of MR elements 30B include a plurality of second element groups arranged in the direction parallel to the second direction D2. The plurality of MR elements 30B thus include a plurality of second specific elements 30B1, a plurality of second specific elements 30B2, and a plurality of second specific elements 30B3. The plurality of second element groups are connected in series by the second wiring 72.

The plurality of second specific elements 30B1 are arranged in the direction parallel to the second direction D2. In FIG. 4, one second specific element 30B1 adjoining the first specific element 30A1 denoted by the reference numeral is denoted by the reference numeral as a representative of the plurality of second specific elements 30B1. Similarly, the plurality of second specific elements 30B2 are arranged in the direction parallel to the second direction D2. In FIG. 4, one second specific element 30B2 adjoining the first specific element 30A2 denoted by the reference numeral is denoted by the reference numeral as a representative of the plurality of second specific elements 30B2. Similarly, the plurality of second specific elements 30B3 are arranged in the direction parallel to the second direction D2. In FIG. 4, one second specific element 30B3 adjoining the first specific element 30A3 denoted by the reference numeral is denoted by the reference numeral as a representative of the plurality of second specific elements 30B3.

The plurality of first element groups and the plurality of second element groups are arranged alternately in the direction parallel to the second direction D2. The plurality of first specific elements 30A1 and the plurality of second specific elements 30B1 are thus arranged alternately in the direction parallel to the second direction D2. The first and second specific elements 30A1 and 30B1 adjoining in the direction parallel to the second direction D2 are not directly electrically connected.

Similarly, the plurality of first specific elements 30A2 and the plurality of second specific elements 30B2 are arranged alternately in the direction parallel to the second direction D2. The first and second specific elements 30A2 and 30B2 adjoining in the direction parallel to the second direction D2 are not directly electrically connected.

Similarly, the plurality of first specific elements 30A3 and the plurality of second specific elements 30B3 are arranged alternately in the direction parallel to the second direction D2. The first and second specific elements 30A3 and 30B3 adjoining in the direction parallel to the second direction D2 are not directly electrically connected.

Note that the plurality of second specific elements 30B1, the plurality of second specific elements 30B2, and the plurality of second specific elements 30B3 are not directly electrically connected to any element, not limited to those adjoining in the direction parallel to the second direction D2, in the plurality of first specific elements 30A1, the plurality of first specific elements 30A2, and the plurality of first specific elements 30A3, except for those directly electrically connected to any of the first to fourth output terminals E11, E12, E21, and E22. In particular, in the example shown in FIG. 4, the first specific elements and the second specific elements adjoin in the direction parallel to the first direction D1, and these elements are not directly electrically connected. The first specific elements and the second specific elements also adjoin in the direction parallel to the second direction D2, and these elements are not directly electrically connected.

Next, the layout of the plurality of yokes 40 will be described in detail. The layout of the plurality of yokes 40 will initially be described with a focus on a plurality of yokes 40 located near the first specific elements 30A1 to 30A3 denoted by the reference numerals in FIG. 4 and the second specific elements 30B1 to 30B3 denoted by the reference numerals in FIG. 4.

As shown in FIG. 4, among the plurality of yokes 40, the one located in front of the first specific element 30A1 denoted by the reference numeral in the second direction D2 will be denoted by the reference numeral 40A. The one located in front of the first specific element 30A2 denoted by the reference numeral in the second direction D2 will be denoted by the reference numeral 40B. The one located in front of the first specific element 30A3 denoted by the reference numeral in the second direction D2 will be denoted by the reference numeral 40C. Among the plurality of yokes 40, the one located in front of the second specific element 30B1 denoted by the reference numeral in the second direction D2 will be denoted by the reference numeral 40D. The one located in front of the second specific element 30B2 denoted by the reference numeral in the second direction D2 will be denoted by the reference numeral 40E. The one located in front of the second specific element 30B3 denoted by the reference numeral in the second direction D2 will be denoted by the reference numeral 40F.

The plurality of yokes 40 include a plurality of yoke pairs each including a first specific yoke and a second specific yoke arranged with one of the plurality of first to third specific elements 30A1 to 30A3 therebetween. In FIG. 4, the yoke 40A and the yoke 40D are arranged with the first specific element 30A1 denoted by the reference numeral therebetween. One of the yokes 40A and 40D thus corresponds to the first specific yoke, and the other of the yokes 40A and 40D the second specific yoke.

The yokes 40A and 40D are located at respective different positions in the direction parallel to the first direction D1, with the first specific element 30A1 denoted by the reference numeral at the center. The first specific element 30A1 denoted by the reference numeral has a first end portion located at the end in the first direction D1 and a second end portion located at the end in the direction opposite to the first direction D1. The end portion of the yoke 40A at the end in the first direction D1 is located in front of the first end portion in the first direction D1. The end portion of the yoke 40D at the end in the direction opposite to the first direction D1 is located in front of the second end portion in the direction opposite to the first direction D1.

Similarly, the yokes 40B and 40E are arranged with the first specific element 30A2 denoted by the reference numeral in FIG. 4 therebetween. One of the yokes 40B and 40E thus corresponds to the first specific yoke, and the other of the yokes 40B and 40E the second specific yoke.

The yokes 40B and 40E are located at respective different positions in the direction parallel to the first direction D1, with the first specific element 30A2 denoted by the reference numeral at the center. The positional relationship between the first specific element 30A2 denoted by the reference numeral, the yoke 40B, and the yoke 40E is similar to that between the first specific element 30A1 denoted by the reference numeral, the yoke 40A, and the yoke 40D.

Similarly, the yokes 40C and 40F are arranged with the first specific element 30A3 denoted by the reference numeral in FIG. 4 therebetween. One of the yokes 40C and 40F thus corresponds to the first specific yoke, and the other of the yokes 40C and 40F the second specific yoke.

The yokes 40C and 40F are located at respective different positions in the direction parallel to the first direction D1, with the first specific element 30A3 denoted by the reference numeral at the center. The positional relationship between the first specific element 30A3 denoted by the reference numeral, the yoke 40C, and the yoke 40F is similar to that between the first specific element 30A1 denoted by the reference numeral, the yoke 40A, and the yoke 40D.

The yoke 40D is interposed between the first specific element 30A1 denoted by the reference numeral in FIG. 4 and a first specific element 30A1 not denoted by the reference numeral in FIG. 4, and interposed between the first specific element 30A2 denoted by the reference numeral in FIG. 4 and a first specific element 30A2 not denoted by the reference numeral in FIG. 4. The yoke 40D is also interposed between the second specific element 30B2 denoted by the reference numeral in FIG. 4 and a second specific element 30B2 not denoted by the reference numeral in FIG. 4.

The yoke 40E is interposed between the first specific element 30A2 denoted by the reference numeral in FIG. 4 and a first specific element 30A2 not denoted by the reference numeral in FIG. 4, and interposed between the first specific element 30A3 denoted by the reference numeral in FIG. 4 and a first specific element 30A3 not denoted by the reference numeral in FIG. 4. The yoke 40E is also interposed between the second specific element 30B3 denoted by the reference numeral in FIG. 4 and a second specific element 30B3 not denoted by the reference numeral in FIG. 4.

Up to this point, the layout of the plurality of yokes 40 has been described with a focus on the plurality of yokes 40 located near the first specific elements 30A1 to 30A3 denoted by the reference numerals in FIG. 4 and the second specific elements 30B1 to 30B3 denoted by the reference numerals in FIG. 4. The foregoing description also applies to the plurality of yokes 40 located near the first specific elements 30A1 to 30A3 not denoted by the reference numerals in FIG. 4 and the second specific elements 30B1 to 30B3 not denoted by the reference numerals in FIG. 4.

The foregoing description also applies to a case where the first specific elements 30A1 to 30A3 and the second specific elements 30B1 and 30B3 are interchanged and the yokes 40A to 40F are changed in position.

As shown in FIGS. 5 and 6, the plurality of yokes 40 are located in front of the plurality of MR elements 30A and the plurality of MR elements 30B in the third direction D3, i.e., the Z direction.

Next, the layout of the plurality of shields 50 will be described in detail. The four shields 50 shown in FIG. 4 will be denoted by the respective reference numerals 50A, 50B, 50C, and 50D. The shields 50A, 50B, 50C, and 50D are arranged in this order in the first direction D1.

The plurality of shields 50 include a plurality of shield pairs each including a first specific shield and a second specific shield arranged with one of the plurality of first specific elements 30A1 to 30A3 therebetween. In FIG. 4, the shield 50A and the shield 50B are arranged with the plurality of first specific elements 30A1 therebetween. One of the shields 50A and 50B thus corresponds to the first specific shield, and the other of the shields 50A and 50B the second specific shield. The shields 50A and 50B are also arranged with the plurality of second specific elements 30B1 therebetween.

Similarly, the shield 50B and the shield 50C are arranged with the plurality of first specific elements 30A2 therebetween. One of the shields 50B and 50C thus corresponds to the first specific shield, and the other of the shields 50B and 50C the second specific shield. The shields 50B and 50C are also arranged with the plurality of second specific elements 30B2 therebetween.

Similarly, the shield 50C and the shield 50D are arranged with the plurality of first specific elements 30A3 therebetween. One of the shields 50C and 50D thus corresponds to the first specific shield, and the other of the shields 50C and 50D the second specific shield. The shields 50C and 50D are also arranged with the plurality of second specific elements 30B3 therebetween.

As shown in FIGS. 5 and 6, the plurality of shields 50 are located in front of the plurality of MR elements 30A and the plurality of MR elements 30B in the third direction D3, i.e., the Z direction.

As shown in FIGS. 4 and 6, some of the plurality of yokes 40 and one of the plurality of shields 50 may be constituted by a single structure, or single soft magnetic body. In such a case, when seen in the third direction D3, i.e., the Z direction, the plurality of yokes 40 include at least one yoke 40 (in the example shown in FIG. 4, a plurality of yokes) intersecting a corresponding one of the plurality of shields 50 in a cross shape and at least one yoke 40 (in the example shown in FIG. 4, a plurality of yokes) intersecting a corresponding one of the plurality of shields 50 in a T shape.

Next, other configurations of the magnetic sensor 1 will be described with reference to FIGS. 5 and 6. The magnetic sensor 1 includes a substrate 61 and insulating layers 62, 63, 64, and 65 as the support member 60. The insulating layer 62 is located on the substrate 61. The plurality of lower electrodes 71A and the plurality of lower electrodes 72A are located on the insulating layer 62. The plurality of MR elements 30A are located on the plurality of lower electrodes 71A. The plurality of MR elements 30B are located on the plurality of lower electrodes 72A. The plurality of upper electrodes 71B are located on the plurality of MR elements 30A. The plurality of upper electrodes 72B are located on the plurality of MR elements 30B. The insulating layer 63 is located around the plurality of MR elements 30A, the plurality of MR elements 30B, the plurality of lower electrodes 71A, the plurality of lower electrodes 72A, the plurality of upper electrodes 71B, and the plurality of upper electrodes 72B.

The insulating layer 64 is located over the insulating layer 63, the plurality of upper electrodes 71B, and the plurality of upper electrodes 72B. The plurality of yokes 40 and the plurality of shields 50 are located on the insulating layer 64. The insulating layer 65 covers the plurality of yokes 40, the plurality of shields 50, and the insulating layer 64.

Figure 7:
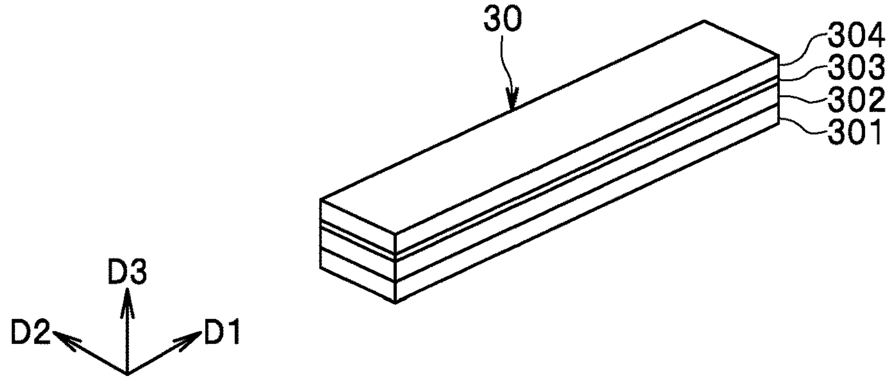
FIG. 7 is a perspective view showing a magnetoresistive element of the first example embodiment of the technology.

Next, a configuration of the MR elements 30 will be described. FIG. 7 is a perspective view showing the MR element 30. FIG. 7 shows the first direction D1, the second direction D2, and the third direction D3 shown in FIGS. 4 to 6.

The MR element 30 is a spin-valve MR element. The MR element 30 includes a magnetization pinned layer 302 having a magnetization whose direction is fixed, a free layer 304 having a magnetization whose direction is variable depending on the direction of the target magnetic field, and a gap layer 303 located between the magnetization pinned layer 302 and the free layer 304. The MR element 30 may be a tunneling magnetoresistive (TMR) element or a giant magnetoresistive (GMR) element. In the TMR element, the gap layer 303 is a tunnel barrier layer. In the GMR element, the gap layer 303 is a nonmagnetic conductive layer. The resistance of the MR element 30 changes with the angle that the magnetization direction of the free layer 304 forms with respect to the magnetization direction of the magnetization pinned layer 302. The resistance of the MR element 30 is at its minimum value when the foregoing angle is 0°, and at its maximum value when the foregoing angle is 180°.

In each MR element 30, the free layer 304 has shape anisotropy such that the direction of a magnetization easy axis is orthogonal to the magnetization direction of the magnetization pinned layer 302. In particular, in the example embodiment, the MR element 30 has a shape long in the direction parallel to the first direction D1. The free layer 304 thus has shape anisotropy such that the direction of the magnetization easy axis is parallel to the first direction D1.

The MR element 30 further includes an antiferromagnetic layer 301. The antiferromagnetic layer 301, the magnetization pinned layer 302, the gap layer 303, and the free layer 304 are stacked in this order in the third direction D3, i.e., the Z direction. The antiferromagnetic layer 301 is formed of an antiferromagnetic material, and is in exchange coupling with the magnetization pinned layer 302 to thereby pin the magnetization direction of the magnetization pinned layer 302. The magnetization pinned layer 302 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 302 is the self-pinned layer, the antiferromagnetic layer 301 may be omitted.

It should be appreciated that the layers 301 to 304 of each MR element 30 may be stacked in the reverse order to that shown in FIG. 7.

In FIG. 3, the hollow arrows indicate the magnetization directions of the magnetization pinned layer 302. In the example embodiment, the magnetization of the magnetization pinned layer 302 of the MR element 30 includes a component in the direction parallel to the second direction D2. Note that, when the magnetization of the magnetization pinned layer 302 contains a component in a specific magnetization direction, the component in the specific magnetization direction may be a main component of the magnetization of the magnetization pinned layer 302. Alternatively, the magnetization of the magnetization pinned layer 302 may not contain a component in a direction orthogonal to the specific magnetization direction. In the present example embodiment, when the magnetization of the magnetization pinned layer 302 contains the component in the specific magnetization direction, the magnetization direction of the magnetization pinned layer 302 is the specific magnetization direction or substantially the specific magnetization direction.

In the example shown in FIG. 3, the magnetization direction of the magnetization pinned layer 302 in each of the plurality of first MR elements 31, the plurality of second MR elements 32, the plurality of third MR elements 33, and the plurality of fourth MR elements 34 is the Y direction. The magnetization direction of the magnetization pinned layer 302 in each of the plurality of fifth MR elements 35, the plurality of sixth MR elements 36, the plurality of seventh MR elements 37, and the plurality of eighth MR elements 38 is the X direction.

Figure 8:
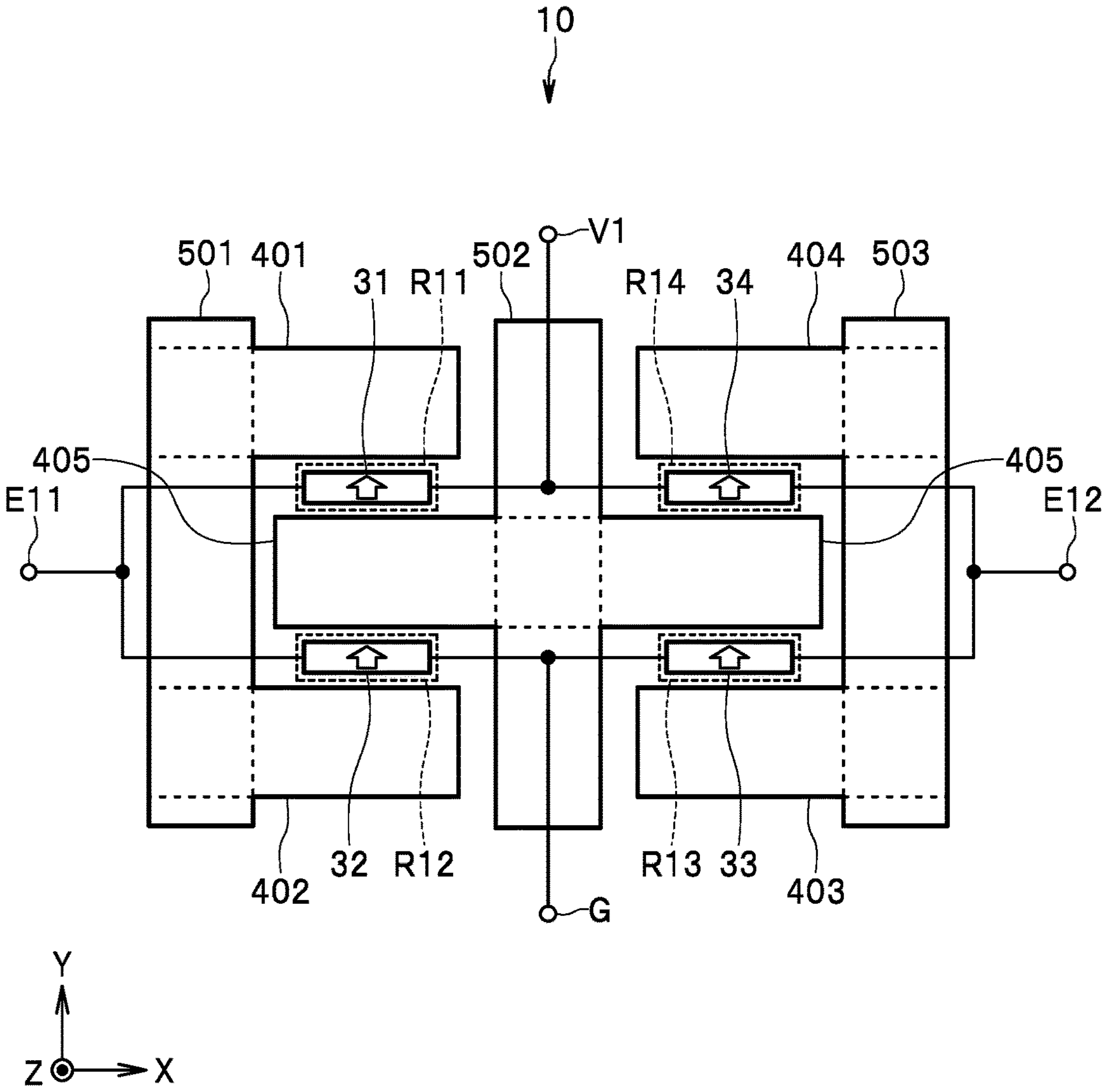
FIG. 8 is an explanatory diagram for describing an operation of the magnetic sensor according to the first example embodiment of the technology.

Next, an operation of the magnetic sensor 1 will be described with reference to FIG. 8. FIG. 8 is an explanatory diagram for describing the operation of the magnetic sensor 1. To facilitate understanding, FIG. 8 schematically shows the first detection circuit 10 of the magnetic sensor 1.

FIG. 8 shows a first MR element 31 as a representative of the plurality of first MR elements 31, a second MR element 32 as a representative of the plurality of second MR elements 32, a third MR element 33 as a representative of the plurality of third MR elements 33, and a fourth MR element 34 as a representative of the plurality of fourth MR elements 34.

In FIG. 8, five yokes 401, 402, 403, 404, and 405 are shown as representatives of the plurality of yokes 40. The yokes 401 and 402 correspond to the first yokes 41 shown in FIG. 3. The yoke 403 and 404 correspond to the second yokes 42 shown in FIG. 3. The yoke 405 serves as both the first and second yokes 41 and 42. The yokes 401 and 402 are arranged so that the yoke 405 is interposed between the yokes 401 and 402. The yokes 403 and 404 are also arranged so that the yoke 405 is interposed between the yokes 403 and 404.

The first MR element 31 is located between the yokes 401 and 405. The second MR element 32 is located between the yokes 402 and 405. The third MR element 33 is located between the yokes 403 and 405. The fourth MR element 34 is located between the yokes 404 and 405.

In FIG. 8, three shields 501, 502, and 503 are shown as representatives of the plurality of shields 50. The first and second MR elements 31 and 32 are located between the shields 501 and 502. The third and fourth MR elements 33 and 34 are located between the shields 502 and 503.

If there is no target magnetic field, the magnetization direction of the free layer 304 in each of the first to fourth MR elements 31 to 34 is parallel to the X direction. If a target magnetic field including a component in the X direction occurs, the magnetic flux corresponding to the component in the X direction passes through the yokes 401 and 402, the yoke 405, and the yokes 403 and 404 in order. A magnetic field including a component in the −Y direction is thereby applied to the first and third MR elements 31 and 33, and a magnetic field including a component in the Y direction is applied to the second and fourth MR elements 32 and 34. In such a case, the magnetization direction of the free layer 304 in each of the first and third MR elements 31 and 33 tilts from the direction parallel to the X direction toward the −Y direction. The magnetization direction of the free layer 304 in each of the second and fourth MR elements 32 and 34 tilts from the direction parallel to the X direction toward the Y direction. As a result, the resistance of each of the first and third MR elements 31 and 33 increases and the resistance of each of the first and third resistor sections R11 and R13 increases compared to that without the target magnetic field. Meanwhile, the resistance of each of the second and fourth MR elements 32 and 34 decreases and the resistance of each of the second and fourth resistor sections R12 and R14 decreases compared to that without the target magnetic field.

If a target magnetic field including a component in the −X direction occurs, the direction of the magnetic field component applied to each of the first to fourth MR elements 31 to 34 and the changes in the resistances of the first to fourth resistor sections R11 to R14 are reversed compared to the case where the target magnetic field including the component in the X direction occurs.

The amount of change in the resistance of each of the first to fourth MR elements 31 to 34 depends on the strength of the component of the magnetic field applied to each of the first to fourth MR elements 31 to 34 in the direction parallel to the Y direction. As the strength of the component parallel to the Y direction increases, the amount of increase or decrease in the resistance of each of the first to fourth MR elements 31 to 34 increases. As the strength of the component parallel to the Y direction decreases, the amount of increase or decrease in the resistance of each of the first to fourth MR elements 31 to 34 decreases. The strength of the component parallel to the Y direction depends on the strength of the component of the target magnetic field in the direction parallel to the X direction.

As employed herein, the component of the target magnetic field in the direction parallel to the X direction will be referred to as an X component of the target magnetic field. As the direction and strength of the X component of the target magnetic field change, the resistance of each of the first to fourth resistor sections R11 to R14 changes so that the resistance of each of the first and third resistor sections R11 and R13 increases and the resistance of each of the second and fourth resistor sections R12 and R14 decreases, or so that the resistance of each of the first and third resistor sections R11 and R13 decreases and the resistance of each of the second and fourth resistor sections R12 and R14 increases. As a result, the potential at each of the first and second output terminals E11 and E12 shown in FIGS. 1 to 3 changes. The magnetic sensor 1 generates two signals corresponding to the potentials at the first and second output terminals E11 and E12 or a signal corresponding to a potential difference between the first and second output terminals E11 and E12 as the at least one first detection signal.

The foregoing description of the first to fourth resistor sections R11 to R14 also applies to the fifth to eighth resistor sections R21 to R24 of the second detection circuit 20. A description of the fifth to eighth resistor sections R21 to R24 is given by replacing the first to fourth resistor sections R11 to R14, the first to fourth MR elements 31 to 34, the first yoke 41, the second yoke 42, the X direction, and the Y direction in the foregoing description of the first to fourth resistor sections R11 to R14 with the fifth to eighth resistor sections R21 to R24, the fifth to eighth MR elements 35 to 38, the third yoke 43, the fourth yoke 44, the Y direction, and the X direction, respectively.

As employed herein, the component of the target magnetic field in the direction parallel to the Y direction will be referred to as a Y component of the target magnetic field. As the direction and strength of the Y component of the target magnetic field change, the resistance of each of the fifth to eighth resistor sections R21 to R24 changes so that the resistance of each of the fifth and seventh resistor sections R21 and R23 increases and the resistance of each of the sixth and eighth resistor sections R22 and R24 decreases, or so that the resistance of each of the fifth and seventh resistor sections R21 and R23 decreases and the resistance of each of the sixth and eighth resistor sections R22 and R24 increases. As a result, the potential at each of the third and four output terminals E21 and E22 shown in FIGS. 1 to 3 changes. The magnetic sensor 1 generates two signals corresponding to the potentials at the third and fourth output terminals E21 and E22 or a signal corresponding to a potential difference between the third and fourth output terminals E21 and E22 as the at least one second detection signal.

Next, a function of the plurality of shields 50 will be described with reference to FIG. 8. If the target magnetic field including the Y component occurs on the first detection circuit 10, most of the magnetic flux corresponding to the Y component passes selectively through the shields 501 to 503. This can prevent a magnetic field in the Y direction due to the Y component of the target magnetic field from being applied to the first to fourth MR elements 31 to 34.

Similarly, if the target magnetic field including the X component occurs on the second detection circuit 20, most of the magnetic flux corresponding to the X component passes selectively through the shields 501 to 503. This can prevent a magnetic field in the X direction due to the X component of the target magnetic field from being applied to the fifth to eighth MR elements 35 to 38.

Figure 9:
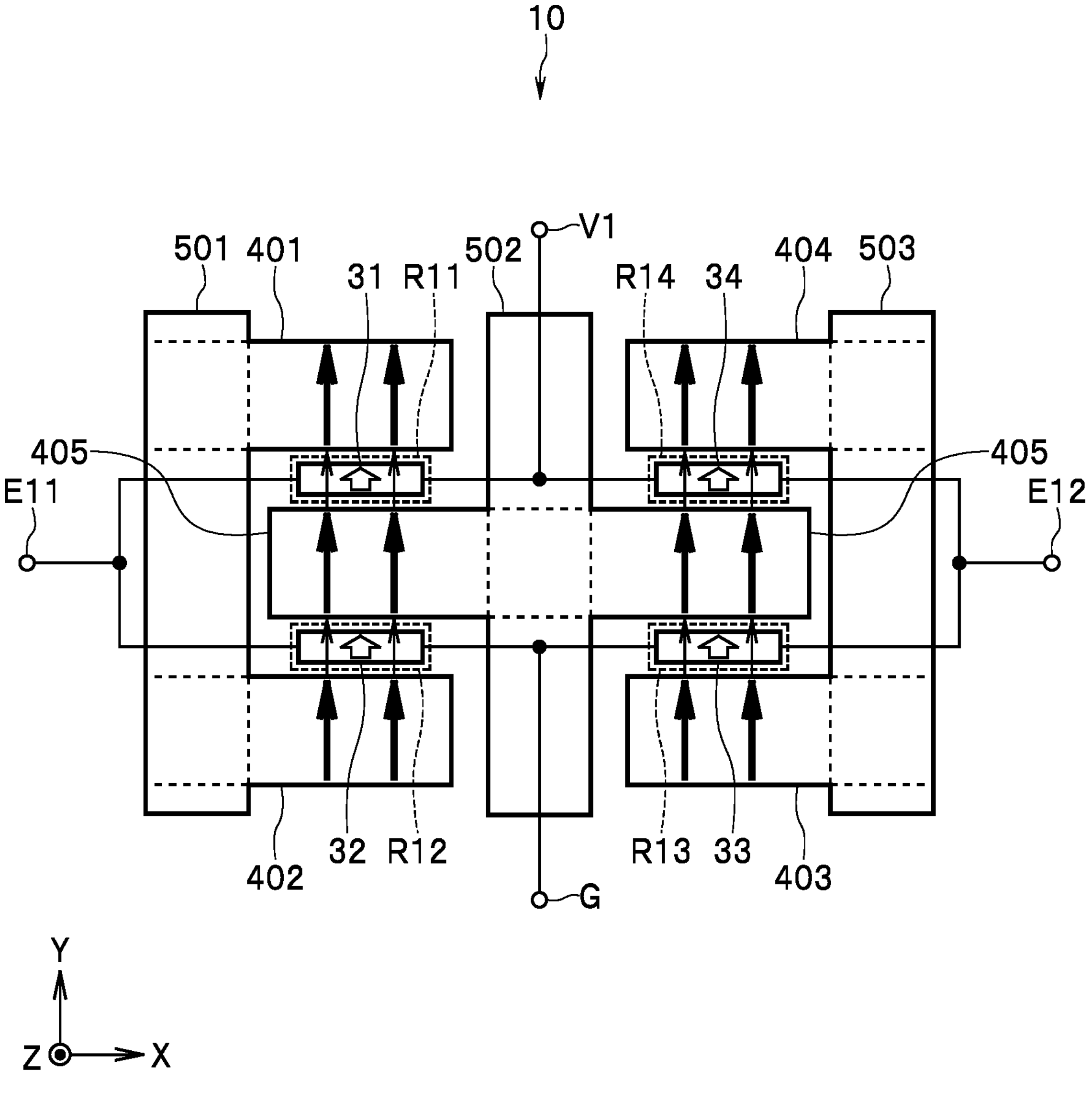
FIG. 9 is an explanatory diagram showing a state of magnetization of the plurality of yokes of the first example embodiment of the technology.
Figure 10:
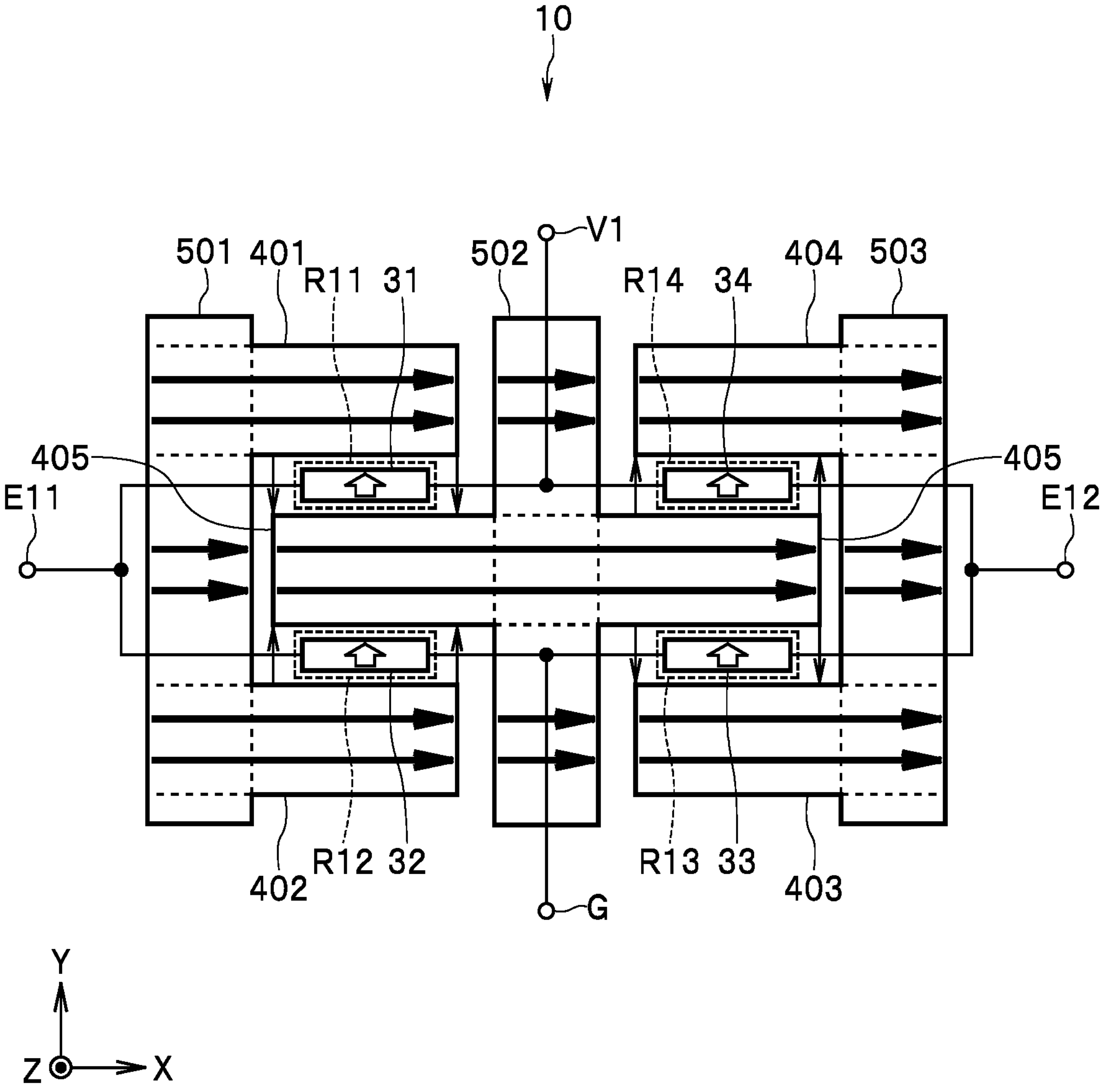
FIG. 10 is an explanatory diagram showing a state of magnetization of the plurality of yokes of the first example embodiment of the technology.

Next, the output of the magnetic sensor 1 in a state where the plurality of yokes 40 are magnetized will be described with reference to FIGS. 9 and 10. FIG. 9 is an explanatory diagram showing the state where the plurality of yokes 40 of the first detection circuit 10 are magnetized in the Y direction. FIG. 10 is an explanatory diagram showing a state where the plurality of yokes 40 of the first detection circuit 10 are magnetized in the X direction. Like FIG. 8, FIGS. 9 and 10 schematically show the first detection circuit 10.

In FIG. 9, the arrows drawn to overlap the yokes 401 to 405 indicate the magnetization directions of the yokes 401 to 405 magnetized by an external magnetic field in the Y direction. The arrows drawn to overlap the first to fourth MR elements 31 to 34 indicate the magnetic fields occurring due to the magnetized yokes 401 to 405. Although not shown in the drawings, the plurality of shields 50 are also magnetized in the Y direction in the environment where the yokes 401 to 405 are magnetized in the Y direction.

As shown in FIG. 9, if each of the yokes 401 to 405 is magnetized in the Y direction, a magnetic field in the Y direction is applied to each of the first to fourth MR elements 31 to 34. In such a case, the magnetization direction of the free layer 304 in each of the first to fourth MR elements 31 to 34 tilts from the direction parallel to the X direction toward the Y direction. As a result, the resistance of each of the first to fourth MR elements 31 to 34 decreases and the resistance of each of the first to fourth resistor sections R11 to R14 decreases compared to when the yokes 401 to 405 are not magnetized. In such a case, the potential at each of the first and second output terminals E11 and E12 shown in FIGS. 1 to 3 does not change. In other words, the at least one first detection signal is not output in such a case.

If each of the yokes 401 to 405 is magnetized in the −Y direction, the direction of the magnetic field component applied to each of the first to fourth MR elements 31 to 34 and the changes in the resistances of the resistor sections R11 to R14 are reversed compared to the case where each of the yokes 401 to 405 is magnetized in the Y direction.

In FIG. 10, the arrows drawn to overlap the yokes 401 to 405 and the plurality of shields 50 indicate the magnetization directions of the yokes 401 to 405 and the plurality of shields 50 magnetized by an external magnetic field in the X direction. The arrows drawn near the end portions of the respective yokes 401 to 405 indicate the magnetic fields occurring due to the magnetized yokes 401 to 405.

As shown in FIG. 10, if each of the yokes 401 to 405 is magnetized in the X direction, magnetic fields occur near the end portion of each of the yokes 401 and 402 in the X direction, near the end portion of each of the yokes 403 and 404 in the −X direction, near the end portion of the yoke 405 in the X direction, and near the end portion of the yoke 405 in the −X direction. As shown in FIG. 10, such magnetic fields can be prevented from being applied to each of the first to fourth MR elements 31 to 34 by laying out each of the first to fourth MR elements 31 to 34 and setting the dimension of each of the first to fourth MR elements 31 to 34 in the direction parallel to the X direction so that the first to fourth MR elements 31 to 34 do not overlap the magnetic fields. In such a case, the potential at each of the first and second output terminals E11 and E12 shown in FIGS. 1 to 3 does not change. In other words, the at least one first detection signal is not output in such a case.

The foregoing description of the case where each of the yokes 401 to 405 is magnetized in the X direction also applies to a case where each of the yokes 401 to 405 is magnetized in the −X direction.

Moreover, the description given of the first detection circuit 10 with reference to FIGS. 9 and 10 also applies to the second detection circuit 20. A description of the second detection circuit 20 is given by replacing the first to fourth resistor sections R11 to R14, the first to fourth MR elements 31 to 34, the X direction, and the Y direction in the foregoing description of the first detection circuit 10 with the fifth to eighth resistor sections R21 to R24, the fifth to eighth MR elements 35 to 38, the Y direction, and the X direction, respectively.

As described above, the magnetic sensor 1 according to the example embodiment includes the plurality of MR elements 30, the plurality of yokes 40 each including a portion long in the first direction D1, and the plurality of shields 50 each including a portion long in the second direction D2. The plurality of MR elements 30 include the plurality of first specific elements 30A1 to 30A3 electrically connected to each other.

The plurality of yokes 40 include the plurality of yoke pairs each including a first specific yoke and a second specific yoke arranged with one of the plurality of first specific elements 30A1 to 30A3 therebetween. In each of the plurality of yoke pairs, the first specific yoke and the second specific yoke are located at respective different positions in the direction parallel to the first direction D1 with the one of the first specific elements 30A1 to 30A3 interposed between the first and second specific yokes at the center.

The plurality of shields 50 include the plurality of shield pairs each including a first specific shield and a second specific shield arranged with one of the first specific elements 30A1 to 30A3 therebetween.

The plurality of first specific elements 30A1 to 30A3 are arranged in the direction intersecting both the first direction D1 and the second direction D2. If the plurality of first specific elements are arranged in the first direction D1 and the plurality of yokes 40 are arranged as shown in FIG. 4, only two first specific elements can be disposed. By contrast, according to the example embodiment, the three first specific elements 30A1 to 30A3 can be disposed. According to the example embodiment, the number of MR elements 30 per unit area can thus be increased.

The plurality of MR elements 30 further include the plurality of second specific elements 30B1 to 30B3 electrically connected to each other and not directly electrically connected to each of the plurality of first specific elements 30A1 to 30A3. The plurality of second specific elements 30B1 to 30B3 are also arranged in the direction intersecting both the first direction D1 and the second direction D2. If the plurality of first specific elements are arranged in the first direction D1 and the plurality of second specific elements are arranged in the first direction D1, the plurality of first specific elements and the plurality of second specific elements are located so that the first specific elements and the second specific elements are arranged alternately in the first direction D1. In such a case, the first wiring 71 for connecting the plurality of first specific elements in series is formed to circumvent the second specific elements, and the second wiring 72 for connecting the plurality of second specific elements is formed to circumvent the first specific elements. Such formation of the first wiring 71 and the second wiring 72 increases the number of intersections of the first wiring 71 and the second wiring 72. This complicates the structure of the first wiring 71 and the second wiring 72.

By contrast, according to the example embodiment, neither of the first wiring 71 and the second wiring 72 needs to be formed to circumvent specific elements. According to the example embodiment, the structure of the first wiring 71 and the second wiring 72, i.e., the structure of the wiring section 70 can thus be simplified.

According to the example embodiment, the magnetic sensor 1 including the plurality of yokes 40 and the plurality of shields 50 can be implemented while increasing the number of MR elements 30 per unit area. In other words, according to the example embodiment, the magnetic sensor 1 having the function of the foregoing plurality of yokes 40 and the function of the foregoing plurality of shields 50 can be implemented.

Next, other effects of the example embodiment will be described. In the first detection circuit 10, the magnetization direction of the magnetization pinned layer 302 in each of the plurality of first MR elements 31 constituting the first resistor section R11, the plurality of second MR elements 32 constituting the second resistor section R12, the plurality of third MR elements 33 constituting the third resistor section R13, and the plurality of fourth MR elements 34 constituting the fourth resistor section R14 is the Y direction. According to the example embodiment, as shown in FIGS. 1 and 2, the first and second resistor sections R11 and R12 can thus be disposed in the same first area A1, and the third and fourth resistor sections R13 and R14 can be disposed in the same second area A2. Given the same number of MR elements 30 each with the planar shape (shape seen in the Z direction) of the same size, the example embodiment can make the planar shape of the support member 60, i.e., the planar shape of the magnetic sensor 1 small compared to the case where the first to fourth resistor sections R11 to R14 are disposed in four separate areas. Given the support member 60 of the same planar shape, i.e., the magnetic sensor 1 of the same planar shape, the example embodiment can increase the number of MR elements 30 compared to the case where the first to fourth resistor sections R11 to R14 are disposed in four separate areas.

The magnetization direction of the magnetization pinned layer 302 in each of the plurality of first MR elements 31, the plurality of second MR elements 32, the plurality of third MR elements 33, and the plurality of fourth MR elements 34 may be the −Y direction.

The foregoing description of the first detection circuit 10 also applies to the second detection circuit 20. The magnetization direction of the magnetization pinned layer 302 in each of the plurality of fifth MR elements 35 constituting the fifth resistor section R21, the plurality of sixth MR elements 36 constituting the sixth resistor section R22, the plurality of seventh MR elements 37 constituting the seventh resistor section R23, and the plurality of eighth MR elements 38 constituting the eighth resistor section R24 may be the X direction or the −X direction.

In the example shown in FIG. 4, the plurality of MR elements 30 include the plurality of MR elements 30C not connected to the first wiring 71 or the second wiring 72. In the example embodiment, the plurality of yokes 40 and the plurality of shields 50 are also provided for the plurality of MR elements 30C. According to the example embodiment, the structure including the plurality of yokes 40 and the plurality of shields 50 can thus be symmetrically shaped about both the XZ plane and the YZ plane. As a result, according to the example embodiment, deviations in the distribution of the magnetic flux passing through the plurality of yokes 40 and the plurality of shields 50 can be reduced.

Second Example Embodiment

Figure 11:
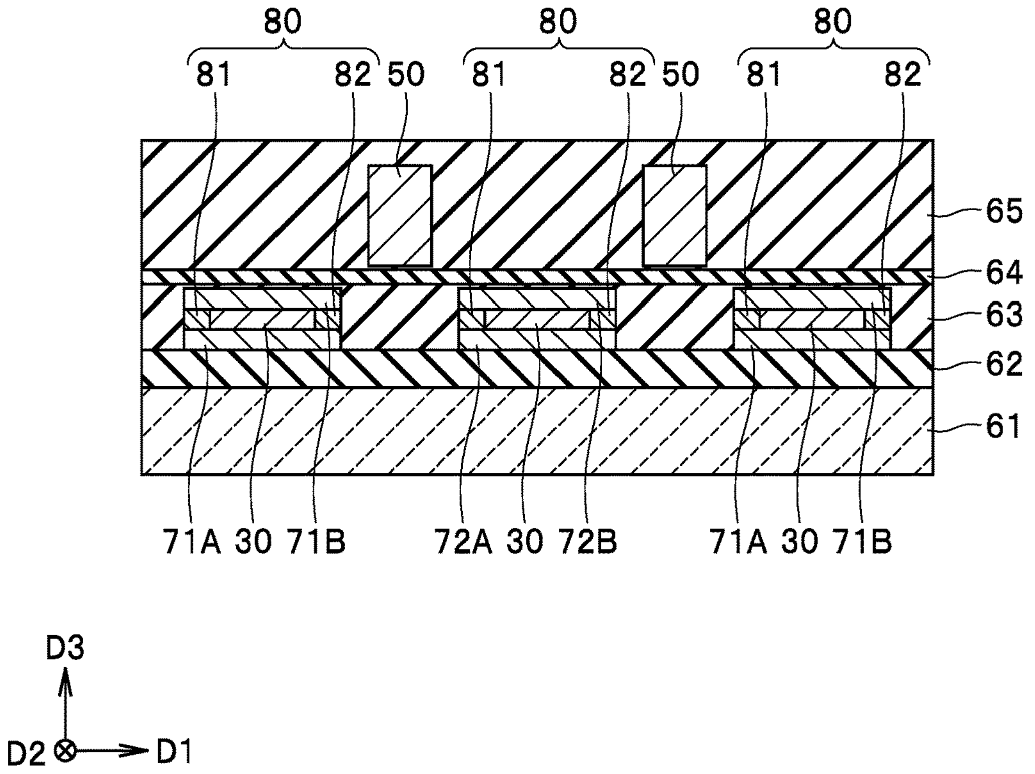
FIG. 11 is a sectional view showing a part of a magnetic sensor according to a second example embodiment of the technology.

Next, a second example embodiment of the technology will be described with reference to FIG. 11. FIG. 11 is a sectional view showing a part of a magnetic sensor 1 according to the example embodiment. FIG. 11 shows a section at the same position as in FIG. 5 according to the first example embodiment.

The magnetic sensor 1 according to the example embodiment includes a plurality of bias magnetic field generation sections 80. The plurality of bias magnetic field generation sections 80 are each configured to generate a bias magnetic field to be applied to a corresponding MR element 30 among a plurality of MR elements 30. The bias magnetic field includes a component in a direction parallel to a first direction D1. If the bias magnetic field includes a component in a specific direction, the component in the specific direction may be the main component of the bias magnetic field. Alternatively, the bias magnetic field may be free of a component in a direction orthogonal to the specific direction. In the example embodiment, if the bias magnetic field includes the component in the specific direction, the magnetization direction of the bias magnetic field is the specific direction or close to the specific direction.

In the example shown in FIG. 11, the plurality of bias magnetic field generation sections 80 include two magnetic field generators 81 and 82 that are arranged in the direction parallel to the first direction D1 and with a corresponding one of the plurality of MR elements 30 therebetween. A not-shown insulating layer is interposed between the two magnetic field generators 81 and 82 and the MR element 30. Each of the two magnetic field generators 81 and 82 is interposed between a lower electrode 71A and an upper electrode 71B. The not-shown insulating layer is also interposed between the two magnetic field generators 81 and 82 and at least one of the lower and upper electrodes 71A and 71B.

Each of the two magnetic field generators 81 and 82 may be a magnet. Alternatively, each of the two magnetic field generators 81 and 82 may be a stack including a ferromagnetic body section and an antiferromagnetic body section in contact with and in exchange coupling with the ferromagnetic body section.

The configuration, operation and effects of the present example embodiment are otherwise the same as those of the first example embodiment.

Third Example Embodiment

Figure 12:
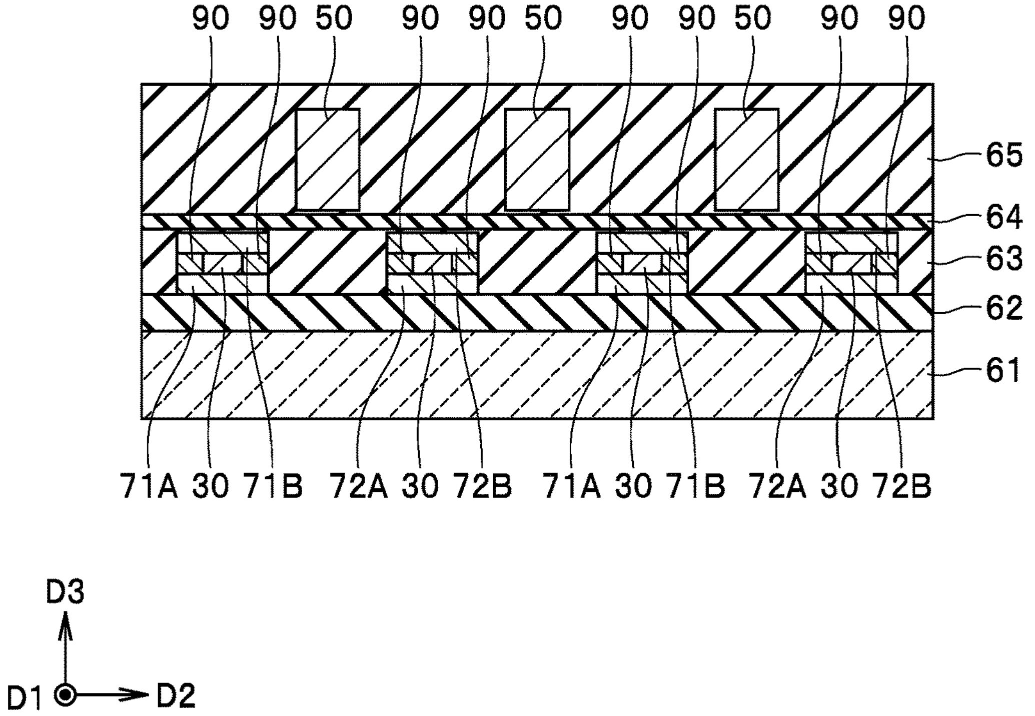
FIG. 12 is a sectional view showing a part of a magnetic sensor according to a third example embodiment of the technology.

Next, a third example embodiment of the technology will be described with reference to FIG. 12. FIG. 12 is a sectional view showing a part of a magnetic sensor 1 according to the example embodiment. FIG. 12 shows a section perpendicular to the section shown in FIG. 5 of the first example embodiment.

The magnetic sensor 1 according to the example embodiment includes a plurality of sub-yokes 90 each made of a soft magnetic body. The plurality of sub-yokes 90 include a plurality of sub-yoke pairs each including two sub-yokes 90. In each of the plurality of sub-yoke pairs, the two sub-yokes 90 are arranged in a direction parallel to a second direction D2 and with a corresponding one of a plurality of MR elements 30 therebetween. Each of the sub-yokes 90 includes a portion long in a first direction D1. A not-shown insulating layer is interposed between the two sub-yokes 90 and the MR element 30. Each of the two sub yokes 90 is interposed between a lower electrode 71A and an upper electrode 71B. The not-shown insulating layer is also interposed between the two sub-yokes 90 and at least one of the lower and upper electrodes 71A and 71B.

The plurality of sub-yokes 90 have a function of guiding magnetic fields occurring from a plurality of yokes 40 due to a target magnetic field to the plurality of MR elements 30.

The configuration, operation and effects of the present example embodiment are otherwise the same as those of the first or second example embodiment.

Fourth Example Embodiment

Figure 13:
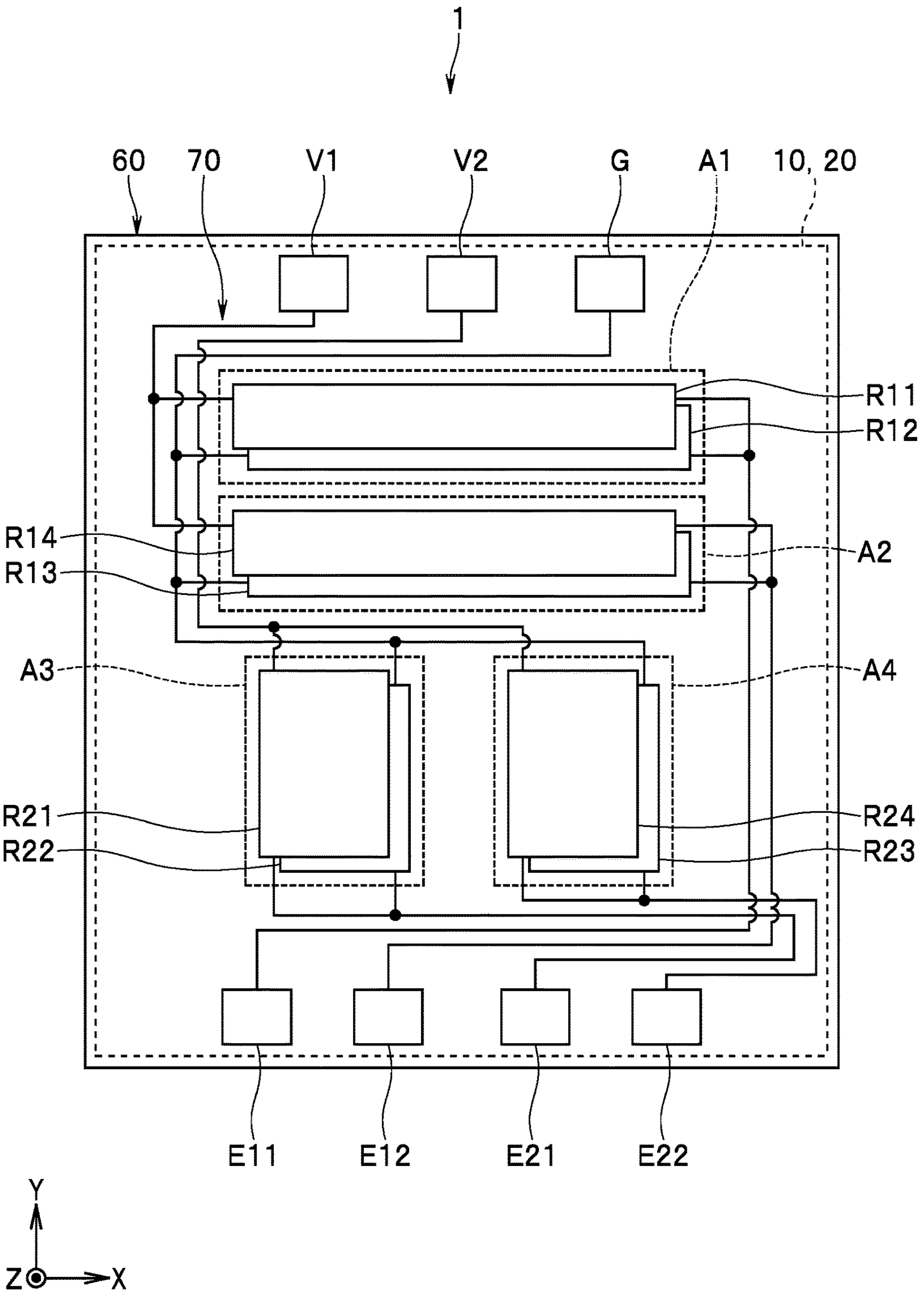
FIG. 13 is a plan view showing an element layout area of a magnetic sensor according to a fourth example embodiment of the technology.

Next, a fourth example embodiment of the technology will be described with reference to FIG. 13. FIG. 13 is a plan view showing an element layout area of a magnetic sensor 1 according to the example embodiment.

In the example embodiment, the layout of first to fourth areas A1 to A4 of the element layout area is different from in the first example embodiment. Specifically, in the example embodiment, the first area A1 and the second area A2 are arranged in a direction parallel to the Y direction, and the third area A3 and the fourth area A4 are arranged in a direction parallel to the X direction. The combined area of the first and second areas A1 and A2 and the combined area of the third and fourth areas A3 and A4 are located at respective different positions in the direction parallel to the Y direction.

In particular, in the example embodiment, the second area A2 is located in front of the first area A1 in the −Y direction. The third and fourth areas A3 and A4 are located in front of the second area A2 in the −Y direction. The fourth area A4 is located in front of the third area A3 in the X direction.

The configuration, operation, and effects of the present example embodiment are otherwise the same as those of any of the first to third example embodiments.

The technology is not limited to the foregoing example embodiments, and various modifications can be made. For example, the plurality of first specific elements may be arranged in a zigzag pattern in the direction intersecting both the first direction D1 and the second direction D2. Similarly, the plurality of second specific elements may be arranged in a zigzag pattern in the direction intersecting both the first direction D1 and the second direction D2.

The first detection circuit 10 may include a half bridge constituted by the first and second resistor sections R11 and R12 or the third and fourth resistor sections R13 and R14 instead of the full bridge constituted by the first to fourth resistor sections R11 to R14. Similarly, the second detection circuit 20 may include a half bridge constituted by the fifth and sixth resistor sections R21 and R22 or the seventh and eighth resistor sections R23 and R24 instead of the full bridge constituted by the fifth to eighth resistor sections R21 to R24.

As described above, a magnetic sensor according to one embodiment of the technology includes a plurality of magnetic detection elements, a plurality of yokes each including a portion long in a first direction, and a plurality of shields each including a portion long in a second direction intersecting the first direction. The plurality of magnetic detection elements include a plurality of first specific elements electrically connected to each other. The plurality of yokes include a plurality of yoke pairs each including a first specific yoke and a second specific yoke arranged with one of the plurality of first specific elements therebetween. In each of the plurality of yoke pairs, the first specific yoke and the second specific yoke are located at respective different positions in a direction parallel to the first direction, with the one first specific element interposed between the first specific yoke and the second specific yoke at a center. The plurality of shields include a plurality of shield pairs each including a first specific shield and a second specific shield arranged with one of the plurality of first specific elements therebetween. The plurality of first specific elements are arranged in a direction intersecting both the first direction and the second direction.

In the magnetic sensor according to one embodiment of the technology, the plurality of magnetic detection elements may include a plurality of first element groups each including the plurality of first specific elements. The plurality of first element groups may be arranged in a direction parallel to the second direction.

In the magnetic sensor according to one embodiment of the technology, in each of the plurality of yoke pairs, at least one of the first and second specific yokes may be interposed between two of the plurality of first specific elements.

In the magnetic sensor according to one embodiment of the technology, the plurality of magnetic detection elements may further include a plurality of second specific elements that are arranged in a direction intersecting both the first direction and the second direction, electrically connected to each other, and not directly electrically connected to each of the plurality of first specific elements. One of the plurality of first specific elements and one of the plurality of second specific elements may be arranged with the first specific yoke or the second specific yoke therebetween. The plurality of magnetic detection elements may include a plurality of first element groups that include the plurality of first specific elements each and are arranged in the second direction, and a plurality of second element groups that include the plurality of second specific elements each and are arranged in the second direction. In each of the plurality of yoke pairs, at least one of the first and second specific yokes may be interposed between two of the plurality of first specific elements and between two of the plurality of second specific elements. The magnetic sensor according to one embodiment of the technology may further include a first terminal, a second terminal, and a third terminal. The plurality of first specific elements may be provided between the first terminal and the second terminal in a circuit configuration. The plurality of second specific elements may be provided between the second terminal and the third terminal in the circuit configuration.

In the magnetic sensor according to one embodiment of the technology, the plurality of magnetic detection elements may further include a plurality of second specific elements that are arranged in a direction intersecting both the first direction and the second direction, electrically connected to each other, and not directly electrically connected to each of the plurality of first specific elements. One of the plurality of first specific elements and one of the plurality of second specific elements may be arranged with the first specific shield or the second specific shield therebetween.

In the magnetic sensor according to one embodiment of the technology, each of the plurality of magnetic detection elements may be a magnetoresistive element including a magnetization pinned layer having a first magnetization and a free layer having a second magnetization whose direction is variable depending on an applied magnetic field. The first magnetization of the magnetization pinned layer may include a component in a predetermined direction. The predetermined direction may be the same in the plurality of magnetic detection elements.

The magnetic sensor according to one embodiment of the technology may include a support member that has a top surface and supports the plurality of magnetic detection elements, the plurality of yokes, and the plurality of shields. The plurality of yokes may include at least one yoke that intersects a corresponding one of the plurality of shields in a cross shape when seen in a direction perpendicular to the top surface of the support member. Alternatively, the plurality of yokes may include at least one yoke that intersects a corresponding one of the plurality of shields in a T-shape when seen in a direction perpendicular to the top surface of the support member.

The magnetic sensor according to one embodiment of the technology may further include a plurality of resistor sections constituted by the plurality of magnetic detection elements. The plurality of magnetic detection elements may be divided and disposed in a plurality of areas corresponding to the plurality of resistor sections. Each of the plurality of areas may have a shape long in the first direction.

The magnetic sensor according to one embodiment of the technology may further include a first power supply terminal, a second power supply terminal, a ground terminal, a first output terminal, a second output terminal, a third output terminal, a fourth output terminal, a first resistor section provided between the first power supply terminal and the first output terminal, a second resistor section provided between the ground terminal and the first output terminal, a third resistor section provided between the ground terminal and the second output terminal, a fourth resistor section provided between the first power supply terminal and the second output terminal, a fifth resistor section provided between the second power supply terminal and the third output terminal, a sixth resistor section provided between the ground terminal and the third output terminal, a seventh resistor section provided between the ground terminal and the fourth output terminal, and an eighth resistor section provided between the second power supply terminal and the fourth output terminal. The first to eighth resistor sections may be constituted by the plurality of magnetic detection elements.

The plurality of magnetic detection elements may further include a plurality of second specific elements that are arranged in a direction intersecting both the first direction and the second direction, electrically connected to each other, and not directly electrically connected to each of the plurality of first specific elements. Both the plurality of first specific elements and the plurality of second specific elements may be divided and disposed in a first area, a second area, a third area, and a fourth area.

The first resistor section may be constituted by a plurality of elements disposed in the first area among the plurality of first specific elements. The second resistor section may be constituted by a plurality of elements disposed in the first area among the plurality of second specific elements. The third resistor section may be constituted by a plurality of elements disposed in the second area among the plurality of first specific elements. The fourth resistor section may be constituted by a plurality of elements disposed in the second area among the plurality of second specific elements. The fifth resistor section may be constituted by a plurality of elements disposed in the third area among the plurality of first specific elements. The sixth resistor section may be constituted by a plurality of elements disposed in the third area among the plurality of second specific elements. The seventh resistor section may be constituted by a plurality of elements disposed in the fourth area among the plurality of first specific elements. The eighth resistor section may be constituted by a plurality of elements disposed in the fourth area among the plurality of second specific elements.

The first area and the second area may be located at a predetermined distance from each other. The third and fourth areas may be located between the first area and the second area and arranged in a direction orthogonal to a direction in which the first area and the second area are arranged.

Obviously, many modifications and variations of the technology are possible in the light of the above teachings. Thus, it is to be understood that, within the scope of the appended claims and equivalents thereof, the technology may be practiced in other example embodiments than the foregoing example embodiments.

What is claimed is:

1. A magnetic sensor comprising:

a plurality of magnetic detection elements;

a plurality of yokes each including a portion long in a first direction; and a plurality of shields each including a portion long in a second direction intersecting the first direction, wherein the plurality of magnetic detection elements include a plurality of first specific elements electrically connected to each other, the plurality of yokes include a plurality of yoke pairs each including a first specific yoke and a second specific yoke arranged with one of the plurality of first specific elements therebetween, in each of the plurality of yoke pairs, the first specific yoke and the second specific yoke are located at respective different positions in a direction parallel to the first direction, with the one first specific element between the first specific yoke and the second specific yoke at the center, the plurality of shields include a plurality of shield pairs each including a first specific shield and a second specific shield arranged with one of the plurality of first specific elements therebetween in the first direction, and the plurality of first specific elements are arranged in a direction intersecting both the first direction and the second direction.

2. The magnetic sensor according to claim 1, wherein:

the plurality of magnetic detection elements include a plurality of first element groups each including the plurality of first specific elements; and the plurality of first element groups are arranged in a direction parallel to the second direction.

3. The magnetic sensor according to claim 1, wherein in each of the plurality of yoke pairs, at least one of the first and second specific yokes is interposed between two of the plurality of first specific elements.

4. The magnetic sensor according to claim 1, wherein:

the plurality of magnetic detection elements further include a plurality of second specific elements that are arranged in a direction intersecting both the first and second directions, electrically connected to each other, and not directly electrically connected to each of the plurality of first specific elements; and one of the plurality of first specific elements and one of the plurality of second specific elements are arranged with the first specific yoke or the second specific yoke therebetween.

5. The magnetic sensor according to claim 4, wherein the plurality of magnetic detection elements include a plurality of first element groups that include the plurality of first specific elements each and are arranged in the second direction, and a plurality of second element groups that include the plurality of second specific elements each and are arranged in the second direction.

6. The magnetic sensor according to claim 4, wherein in each of the plurality of yoke pairs, at least either one of the first and second specific yokes is interposed between two of the plurality of first specific elements and between two of the plurality of second specific elements.

7. The magnetic sensor according to claim 4, further comprising:

a first terminal;

a second terminal; and a third terminal, wherein the plurality of first specific elements are provided between the first terminal and the second terminal in a circuit configuration, and the plurality of second specific elements are provided between the second terminal and the third terminal in the circuit configuration.

8. The magnetic sensor according to claim 1, wherein:

the plurality of magnetic detection elements further include a plurality of second specific elements that are arranged in a direction intersecting both the first direction and the second direction, electrically connected to each other, and not directly electrically connected to each of the plurality of first specific elements; and one of the plurality of first specific elements and one of the plurality of second specific elements are arranged with the first specific shield or the second specific shield therebetween.

9. The magnetic sensor according to claim 1, wherein:

each of the plurality of magnetic detection elements is a magnetoresistive element including a magnetization pinned layer having a first magnetization and a free layer having a second magnetization whose direction is variable depending on an applied magnetic field;

the first magnetization of the magnetization pinned layer includes a component in a predetermined direction; and the predetermined direction is same in the plurality of magnetic detection elements.

10. The magnetic sensor according to claim 1, further comprising a support member that has a top surface and supports the plurality of magnetic detection elements, the plurality of yokes, and the plurality of shields, wherein the plurality of yokes include at least one yoke that intersects a corresponding one of the plurality of shields in a cross shape when seen in a direction perpendicular to the top surface of the support member.

11. The magnetic sensor according to claim 1, further comprising a support member that has a top surface and supports the plurality of magnetic detection elements, the plurality of yokes, and the plurality of shields, wherein the plurality of yokes include at least one yoke that intersects a corresponding one of the plurality of shields in a T-shape when seen in a direction perpendicular to the top surface of the support member.

12. The magnetic sensor according to claim 1, further comprising a plurality of resistor sections constituted by the plurality of magnetic detection elements, wherein:

the plurality of magnetic detection elements are divided and disposed in a plurality of areas corresponding to the plurality of resistor sections; and each of the plurality of areas has a shape long in the first direction.

13. The magnetic sensor according to claim 1, wherein the plurality of first specific elements are arranged one after another in the direction intersecting both the first direction and the second direction.

14. The magnetic sensor according to claim 1, wherein the first specific shield and the second specific shield are arranged to have a portion of the first specific yoke and a portion of the second specific yoke therebetween in the first direction.

15. A magnetic sensor comprising:

a plurality of magnetic detection elements;

a plurality of yokes each including a portion long in a first direction;

a plurality of shields each including a portion long in a second direction intersecting the first direction, wherein the plurality of magnetic detection elements include a plurality of first specific elements electrically connected to each other, the plurality of yokes include a plurality of yoke pairs each including a first specific yoke and a second specific yoke arranged with one of the plurality of first specific elements therebetween, in each of the plurality of yoke pairs, the first specific yoke and the second specific yoke are located at respective different positions in a direction parallel to the first direction, with the one first specific element between the first specific yoke and the second specific yoke at the center, the plurality of shields include a plurality of shield pairs each including a first specific shield and a second specific shield arranged with one of the plurality of first specific elements therebetween, and the plurality of first specific elements are arranged in a direction intersecting both the first direction and the second direction;

a first power supply terminal;

a second power supply terminal;

a ground terminal;

a first output terminal;

a second output terminal;

a third output terminal;

a fourth output terminal;

a first resistor section provided between the first power supply terminal and the first output terminal;

a second resistor section provided between the ground terminal and the first output terminal;

a third resistor section provided between the ground terminal and the second output terminal;

a fourth resistor section provided between the first power supply terminal and the second output terminal;

a fifth resistor section provided between the second power supply terminal and the third output terminal;

a sixth resistor section provided between the ground terminal and the third output terminal;

a seventh resistor section provided between the ground terminal and the fourth output terminal; and an eighth resistor section provided between the second power supply terminal and the fourth output terminal, wherein the first to eighth resistor sections are constituted by the plurality of magnetic detection elements, the plurality of magnetic detection elements further include a plurality of second specific elements that are arranged in a direction intersecting both the first direction and the second direction, electrically connected to each other, and not directly electrically connected to each of the plurality of first specific elements, both the plurality of first specific elements and the plurality of second specific elements are divided and disposed in a first area, a second area, a third area, and a fourth area, the first resistor section is constituted by a plurality of elements disposed in the first area among the plurality of first specific elements, the second resistor section is constituted by a plurality of elements disposed in the first area among the plurality of second specific elements, the third resistor section is constituted by a plurality of elements disposed in the second area among the plurality of first specific elements, the fourth resistor section is constituted by a plurality of elements disposed in the second area among the plurality of second specific elements, the fifth resistor section is constituted by a plurality of elements disposed in the third area among the plurality of first specific elements, the sixth resistor section is constituted by a plurality of elements disposed in the third area among the plurality of second specific elements, the seventh resistor section is constituted by a plurality of elements disposed in the fourth area among the plurality of first specific elements, the eighth resistor section is constituted by a plurality of elements disposed in the fourth area among the plurality of second specific elements, the first area and the second area are located at a predetermined distance from each other, and the third area and the fourth area are located between the first area and the second area and arranged in a direction orthogonal to a direction in which the first area and the second area are arranged.

* * * * *